(12) United States Patent
Rimini et al.

(10) Patent No.: US 12,388,479 B2
(45) Date of Patent: Aug. 12, 2025

(54) INJECTING A FREQUENCY-MODULATED SIGNAL INTO A RECEIVER

(71) Applicant: QUALCOMM Incorporated, San Diego, CA (US)

(72) Inventors: Roberto Rimini, San Diego, CA (US); Sriramgopal Sridhara, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 456 days.

(21) Appl. No.: 17/933,601

(22) Filed: Sep. 20, 2022

(65) Prior Publication Data

US 2024/0097724 A1    Mar. 21, 2024

(51) Int. Cl.

| | |
|---|---|
| *H04B 1/10* | (2006.01) |
| *H03B 5/12* | (2006.01) |
| *H03L 7/099* | (2006.01) |
| *H03L 7/24* | (2006.01) |
| *H04B 1/04* | (2006.01) |
| *H04B 1/16* | (2006.01) |

(52) U.S. Cl.
CPC ......... *H04B 1/0483* (2013.01); *H03B 5/1228* (2013.01); *H03L 7/099* (2013.01); *H03L 7/24* (2013.01); *H04B 1/1607* (2013.01); *H03B 2200/0074* (2013.01)

(58) Field of Classification Search
CPC .... H04B 1/0483; H04B 1/1607; H04B 1/123; H04B 1/1027; H03B 5/1228; H03B 2200/0074; H03L 7/099; H03L 7/24; H04W 52/283
See application file for complete search history.

(56) References Cited

U.S. PATENT DOCUMENTS

| | | | |
|---|---|---|---|
| 2017/0141857 A1* | 5/2017 | Casagrande | H03C 3/095 |
| 2018/0188317 A1* | 7/2018 | Maiellaro | G01R 31/2884 |
| 2018/0287651 A1* | 10/2018 | Fernando | H01Q 1/245 |
| 2021/0116501 A1* | 4/2021 | Martineau | H03B 5/1203 |
| 2021/0399733 A1* | 12/2021 | Chang | H03L 7/099 |

OTHER PUBLICATIONS

International Search Report and Written Opinion—PCT/US2023/072996—ISA/EPO—Jan. 9, 2024, 12 pages.

* cited by examiner

*Primary Examiner* — Kenneth T Lam
(74) *Attorney, Agent, or Firm* — Smith Tempel Blaha LLC/Qualcomm Incorporated

(57) ABSTRACT

An apparatus is disclosed for injecting a frequency-modulated signal into a receiver. In an example aspect, the apparatus includes a receiver, a local oscillator circuit, and an injection circuit. The receiver comprises a signal propagation path. The local oscillator circuit is configured to generate a frequency-modulated signal. The injection circuit is coupled to the receiver and the local oscillator circuit. The injection circuit is configured to selectively connect the local oscillator circuit to the signal propagation path of the receiver to inject the frequency-modulated signal into the signal propagation path of the receiver. The injection circuit is also configured to disconnect the local oscillator circuit from the signal propagation path of the receiver.

30 Claims, 12 Drawing Sheets

900

```
┌─────────────────────────────────────────────────┐
│ Disconnect a local oscillator circuit from a mixer │
│     of a receiver based on a calibration mode    │
│                       902                        │
└─────────────────────────────────────────────────┘
                        │
                        ▼
┌─────────────────────────────────────────────────┐
│ Connect the local oscillator circuit to an input or an output │
│ of a component that is disposed within a signal propagation │
│   path of the receiver based on the calibration mode   │
│                       904                        │
└─────────────────────────────────────────────────┘
                        │
                        ▼
┌─────────────────────────────────────────────────┐
│  Generate, by the local oscillator circuit, a frequency-  │
│   modulated signal in accordance with the calibration mode │
│                       906                        │
└─────────────────────────────────────────────────┘
                        │
                        ▼
┌─────────────────────────────────────────────────┐
│     Inject the frequency-modulated signal into      │
│      the signal propagation path of the receiver     │
│                       908                        │
└─────────────────────────────────────────────────┘
```

FIG. 9

INJECTING A FREQUENCY-MODULATED SIGNAL INTO A RECEIVER

TECHNICAL FIELD

This disclosure relates generally to wireless transceivers and, more specifically, to measuring a frequency response of a receiver.

BACKGROUND

To increase transmission rates and throughput, cellular and other wireless networks are using signals with higher-order modulations, such as 64 or 256 quadrature amplitude modulation (QAM). Use of these higher-order modulations, however, is limited based on a signal-to-noise ratio that can be achieved in a receiver. If the signal-to-noise ratio is insufficient, a bit error rate of the receiver may become unacceptable.

SUMMARY

An apparatus is disclosed that injects a frequency-modulated signal into a receiver. In some implementations, the frequency-modulated signal can be injected at various points within a signal propagation path of the receiver. For example, the frequency-modulated signal can be injected at a point associated with radio frequencies, intermediate frequencies, and/or baseband frequencies. Starting at the point of injection, the frequency-modulated signal propagates through the receiver and is subjected to any distortion that occurs along the signal propagation path. The frequency response of the receiver is measured based on the propagated frequency-modulated signal, and a response of an inverse filter is determined to compensate for the distortion. By compensating for the distortion, a signal-to-noise ratio performance of the receiver can be, for example, sufficient to enable use of higher-order modulations for wireless communication while achieving an acceptable bit error rate. Additionally or alternatively, the distortion compensation can improve position and/or movement accuracies associated with proximity detection.

In an example aspect, an apparatus for injecting a frequency-modulated signal into a receiver is disclosed. The apparatus includes a receiver, a local oscillator circuit, and an injection circuit. The receiver comprises a signal propagation path. The local oscillator circuit is configured to generate a frequency-modulated signal. The injection circuit is coupled to the receiver and the local oscillator circuit. The injection circuit is configured to selectively connect the local oscillator circuit to the signal propagation path of the receiver to inject the frequency-modulated signal into the signal propagation path of the receiver. The injection circuit is also configured to disconnect the local oscillator circuit from the signal propagation path of the receiver.

In an example aspect, an apparatus for injecting a frequency-modulated signal into a receiver is disclosed. The apparatus includes means for receiving a wireless communication signal during a wireless communication mode. The means for receiving the wireless communication signal includes a signal propagation path. The apparatus also includes means for generating a frequency-modulated signal during a calibration mode. The apparatus additionally includes means for injecting the frequency-modulated signal within the signal propagation path during the calibration mode.

In an example aspect, a method for injecting a frequency-modulated signal into a receiver is disclosed. The method includes disconnecting a local oscillator circuit from a mixer of a receiver based on a calibration mode. The method also includes connecting the local oscillator circuit to an input or an output of a component that is disposed within a signal propagation path of the receiver based on the calibration mode. The method additionally includes generating, by the local oscillator circuit, a frequency-modulated signal in accordance with the calibration mode. The method further includes injecting the frequency-modulated signal into the signal propagation path of the receiver.

In an example aspect, an apparatus is disclosed for injecting a frequency-modulated signal into a receiver. The apparatus includes a modem configured to generate a mode control signal. The apparatus also includes a wireless transceiver coupled to the modem and including a portion of a signal propagation path of a receiver. The wireless transceiver is configured to accept a mode control signal. The wireless transceiver is also configured to receive a downlink signal using the portion of the signal propagation path of the receiver based on the mode control signal indicating a wireless communication mode. The wireless transceiver is also configured to inject a frequency-modulated signal into the signal propagation path of the receiver based on the mode control signal indicating a calibration mode.

BRIEF DESCRIPTION OF DRAWINGS

FIG. 2-1 illustrates an example operating environment for a computing device.

FIG. 2-2 illustrates another example operating environment for a computing device.

FIG. 8-1 illustrates an example configuration of a radio-frequency integrated circuit during a calibration mode.

FIG. 8-2 illustrates an example configuration of a radio-frequency integrated circuit during a wireless communication mode.

FIG. 8-3 illustrates an example configuration of a radio-frequency integrated circuit during a proximity detection mode.

FIG. 9 is a flow diagram illustrating an example process for injecting a frequency-modulated signal into a receiver.

DETAILED DESCRIPTION

Figure 1:
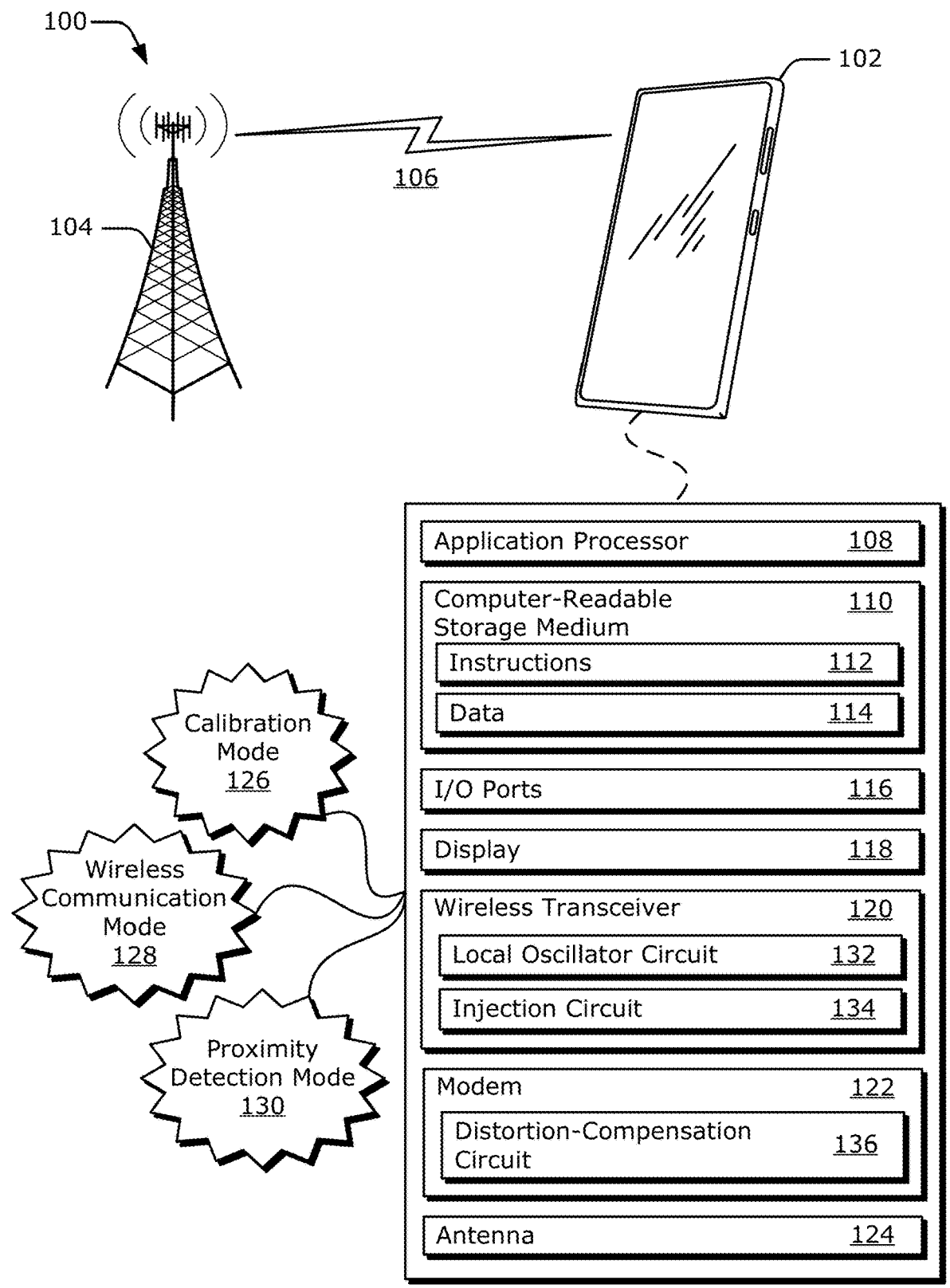
FIG. 1 illustrates an example computing device for injecting a frequency-modulated signal into a receiver.

To increase transmission rates and throughput, cellular and other wireless networks are using signals with higher-order modulations, such as 64 or 256 quadrature amplitude modulation (QAM). Use of these higher-order modulations, however, is limited based on a signal-to-noise ratio that can be achieved in a receiver. If the signal-to-noise ratio is insufficient, a bit error rate of the receiver may become unacceptable.

One source of degradation that can impact the signal-to-noise ratio of the receiver includes distortion within passbands of filters within the receiver. Example types of distortion can include ripples within the passband or droop at an edge of the passband. To improve the signal-to-noise ratio, it is desirable for the receiver to have a near distortionless frequency response. To address this challenge, some techniques measure an overall frequency response of the receiver and implement an inverse filter to compensate for the distortion. However, these techniques can be quite complex by utilizing internal noise sources to estimate the overall frequency response of the receiver. Sometimes these noise sources do not behave as white noise. As such, the frequency spectrum of the noise is not necessarily flat unless averaged over a significant period of time, which can be on the order of seconds. While estimating the overall frequency response of the receiver, the receiver is unable to support wireless communication operations, which can be undesirable for this length of time.

In contrast, techniques for injecting a frequency-modulated signal into a receiver are described herein. In some implementations, the frequency-modulated signal can be injected at various points within a signal propagation path of the receiver. For example, the frequency-modulated signal can be injected at a point associated with radio frequencies, intermediate frequencies, and/or baseband frequencies. Starting at the point of injection, the frequency-modulated signal propagates through the receiver and is subjected to any distortion that occurs along the signal propagation path. The frequency response of the receiver is measured based on the propagated frequency-modulated signal, and a response of an inverse filter is determined to compensate for the distortion. By compensating for the distortion, a signal-to-noise ratio performance of the receiver can be, for example, sufficient to enable use of higher-order modulations for wireless communication while achieving an acceptable bit error rate. Additionally or alternatively, the distortion compensation can improve position and/or movement accuracies associated with proximity detection.

The frequency-modulated signal can have a sufficiently large bandwidth and a substantially flat frequency response to enable the receiver's frequency response to be measured quickly (e.g., on the order of microseconds) compared to other techniques that rely on an internal noise source. Also, the frequency response of the receiver can be readily extracted from time-domain samples of the frequency-modulated signal. As such, it can be less computationally intensive to determine an appropriate response of an inverse filter that compensates for the distortion.

FIG. 1 illustrates an example environment 100 for injecting a frequency-modulated signal into a receiver. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a customer premises equipment (CPE), a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and/or a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, ultra-wideband (UWB) network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 124. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 124.

The computing device 102 also includes a modem 122, which is coupled to the wireless transceiver 120. The modem 122, which may comprise one or more processors, can be implemented within or separate from the wireless transceiver 120. Although not explicitly shown, the modem 122 can include a portion of the CRM 110 or can access the CRM 110 to obtain computer-readable instructions. The modem 122 controls the wireless transceiver 120 and enables a variety of different modes to be executed. The modem 122 can include baseband circuitry to perform high-rate sampling processes that can include analog-to-digital conversion, digital-to-analog conversion, Fourier transforms, gain correction, skew correction, frequency translation, and so forth. The modem 122 can provide communication data to the wireless transceiver 120 for transmission. The modem 122 can also process baseband signals obtained from the wireless transceiver 120 to generate data, which can be provided to the computing device 102.

To increase transmission rates and throughput using higher-order modulations, the computing device 102 can perform distortion compensation by applying a filter that compensates for at least a portion of the distortion generated by a receiver of the computing device 102. During a calibration mode 126, the computing device 102 injects a frequency-modulated signal into a signal propagation path of the receiver to determine an appropriate frequency response of the filter.

The computing device 102 can also increase transmission rates and throughput by using signals with higher frequencies and smaller wavelengths. As an example, the computing device 102 can represent a $5^{th}$-generation (5G)-capable device that uses frequencies that include those at or near the extremely-high frequency (EHF) spectrum (e.g., frequencies greater than 24 gigahertz (GHz)) with wavelengths at or near millimeter wavelengths. These signals have various technological challenges, such as higher path loss as compared to signals for earlier generations of wireless communications. In certain scenarios it can be difficult for a 5G wireless signal to travel far enough to make cellular communications feasible at these higher frequencies.

Transmit power levels can be increased or transmit beamforming can concentrate energy in a particular direction to compensate for the higher path loss. These types of compensation techniques, however, increase power densities. The Federal Communications Commission (FCC) has determined a maximum permitted exposure (MPE) limit to accommodate these higher power densities.

To meet targeted guidelines based on the MPE limit, the computing device 102 can balance performance with transmit power and other considerations. To realize this balancing act, some implementations of the computing device 102 perform proximity detection in addition to wireless communication. In this case, the computing device 102 can operate in accordance with the wireless communication mode 128 to perform wireless communication and operate in accordance with the proximity detection mode 130 to perform proximity detection.

To support the calibration mode 126 and the wireless communication mode 128 (and optionally the proximity detection mode 130), the wireless transceiver 120 includes at least one local oscillator circuit 132 and at least one injection circuit 134. The local oscillator circuit 132 generates a reference signal that supports an active mode. For the calibration mode 126 and/or the proximity detection mode 130, the reference signal can be a frequency-modulated signal. For the wireless communication mode 128, the reference signal can be a local oscillator signal.

The injection circuit 134 enables the frequency-modulated signal provided by the local oscillator circuit 132 to be injected into the signal propagation path of the receiver during the calibration mode 126. The injection circuit 134 provides this injection point for the calibration mode 126 without substantially impacting performance of the other modes, such as the wireless communication mode 128 or the proximity detection mode 130. Together, the local oscillator circuit 132 and the injection circuit 134 implement, at least in part, aspects of injecting a frequency-modulated signal into a receiver.

The modem 122 includes a distortion-compensation circuit 136. During the calibration mode 126, the distortion-compensation circuit 136 measures a frequency response of the receiver based on the injected frequency-modulated signal. During the wireless communication mode 128 and/or the proximity detection mode 130, the distortion-compensation circuit 136 applies a filter that at least partially compensates for the distortion previously measured during the calibration mode 126. By compensating for this distortion, the distortion-compensation circuit 136 enables the computing device 102 to support the use of higher-order modulations during the wireless communication mode 128 and/or enables more accurate target detection in the proximity detection mode 130. Aspects of the wireless communication mode 128 and the proximity detection mode 130 are further described with respect to FIGS. 2-1, 2-2, and 3.

Figures 1, 2:
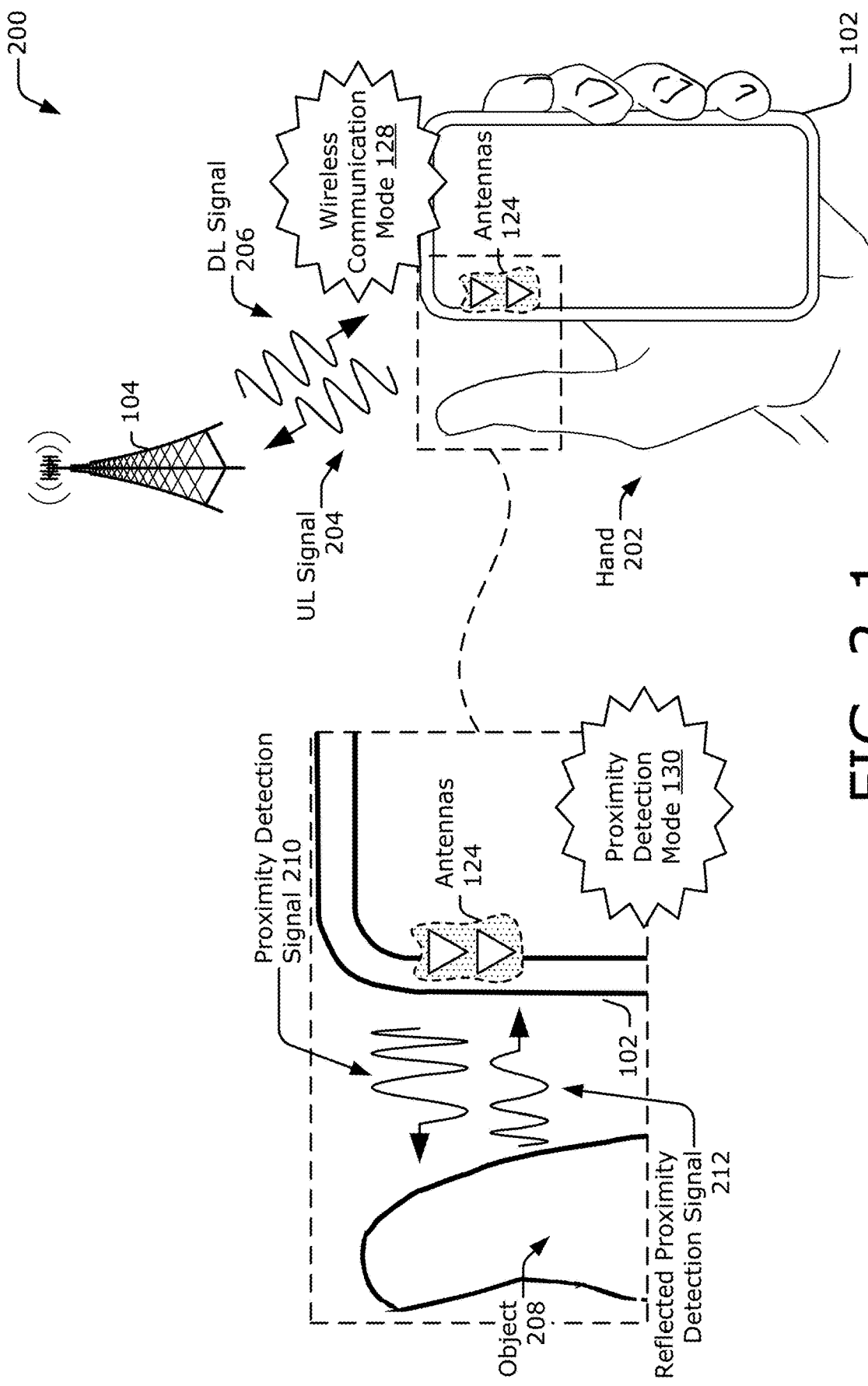
Figure 2:
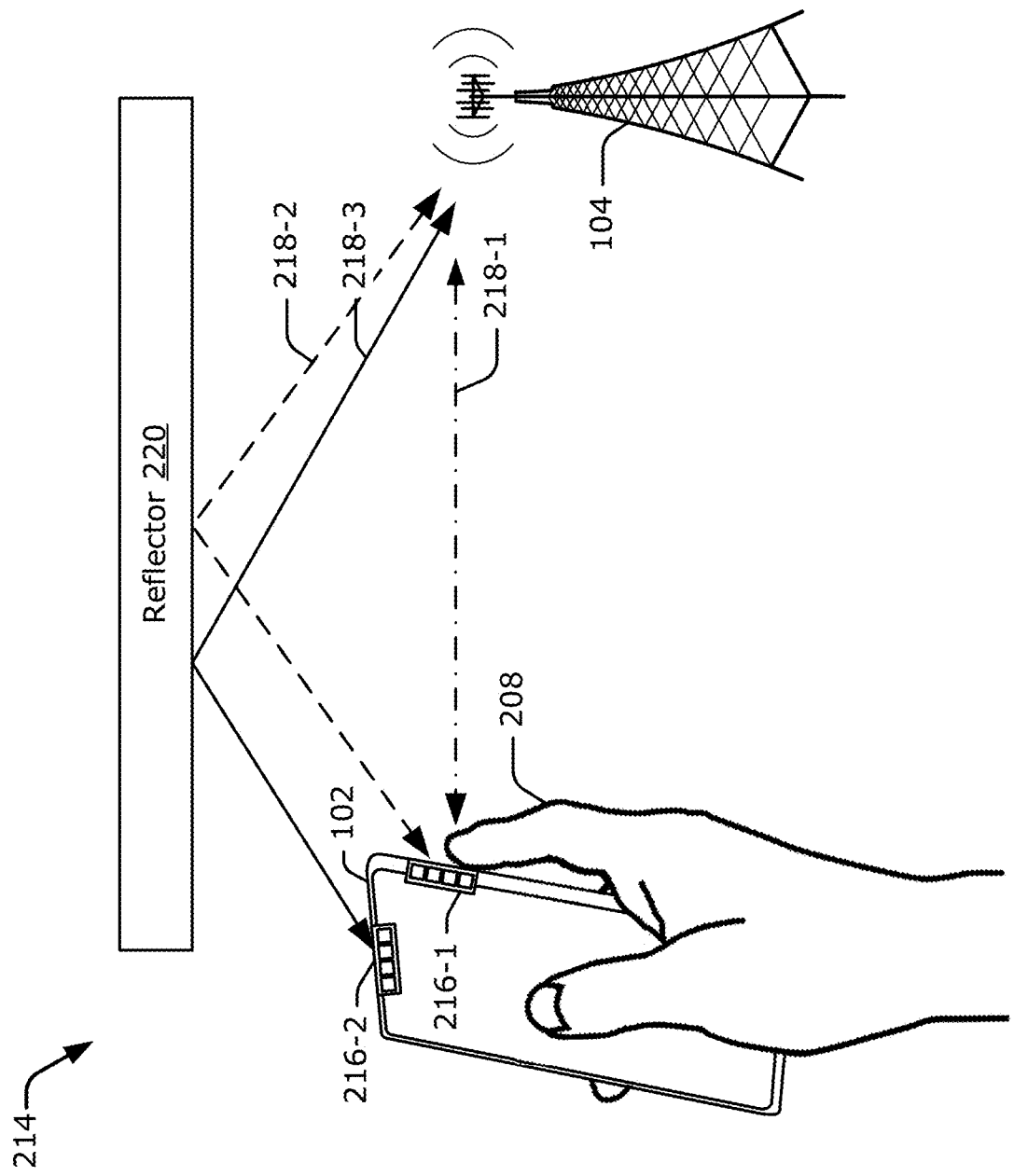

FIG. 2-1 illustrates an example operating environment 200 for the computing device 102. In the example environment 200, a hand 202 of a user holds the computing device 102. During the wireless communication mode 128, the computing device 102 communicates with the base station 104 by transmitting an uplink signal 204 (UL signal 204) or receiving a downlink signal 206 (DL signal 206) via antennas 124. A user's thumb, however, can represent an object 208 that may be exposed to radiation via the uplink signal 204 and obstruct one or more of the antennas 124.

To detect whether the object 208 exists or is within a detectable range and angle, the computing device 102 operates in accordance with the proximity detection mode 130. During the proximity detection mode 130, the computing device 102 transmits a proximity detection signal 210 via at least one of the antennas 124. The proximity detection signal 210 can be a frequency-modulated continuous-wave (FMCW) signal or a frequency-modulated pulsed signal. The type of frequency modulation can include a linear frequency modulation, a triangular frequency modulation, a sawtooth frequency modulation, and so forth. The proximity detection signal 210 propagates through space and is reflected, at least partially, by the object 208.

The computing device 102 additionally receives, via one or more of the antennas 124, a reflected proximity detection signal 212, which represents a version of the proximity detection signal 210 that is reflected by the object 208. Based on the reflected proximity detection signal 212, the presence of the object 208 can be determined. In some implementations, the computing device 102 also determines a position (e.g., slant range, azimuth, and/or elevation) of the object 208.

FIG. 2-2 illustrates another example operating environment 214 for the computing device 102. In the depicted configuration, the computing device 102 includes antenna arrays 216-1 and 216-2. Through the antenna arrays 216-1 and 216-2, the computing device 102 can communicate with the base station 104 through multiple signal paths 218-1 to 218-3. A first signal path 218-1 represents a direct signal path between the antenna array 216-1 and the base station 104. A second signal path 218-2 represents an indirect signal path between the antenna array 216-1, a reflector 220, and the base station 104. A third signal path 218-3 represents an indirect signal path between the antenna array 216-2, the reflector 220, and the base station 104.

In the depicted environment, an object 208 (e.g., a finger) blocks the first signal path 218-1. Through proximity detection, the computing device 102 determines that the antenna array 216-1 is obstructed. As such, the computing device 102 can adjust transmission parameters for the uplink signal 204 based on the detection. In some implementations, the transmission parameters specify a different beam steering angle that enables the uplink signal 204 to be transmitted via the antenna array 216-1 using the second signal path 218-2 instead of the first signal path 218-1. The beam steering angle can decrease radiation exposure at the object 208 by directing a main-lobe of the uplink signal 204 away from the object 208. Additionally or alternatively, a transmit power for the uplink signal 204 can be reduced for the second signal path 218-2 or the first signal path 218-1.

In other situations, the transmission parameters can specify a different antenna array 216 for transmitting the communication signal. For example, the antenna array 216-2 can be used instead of the antenna array 216-1 to transmit the uplink signal 204 using the third signal path 218-3. By adjusting the transmission parameters, the computing device 102 can maintain communication with the base station 104 while ensuring compliance. An example sequence for switching between the wireless communication mode 128 and the proximity detection mode 130 is further described with respect to FIG. 3

Figure 3:
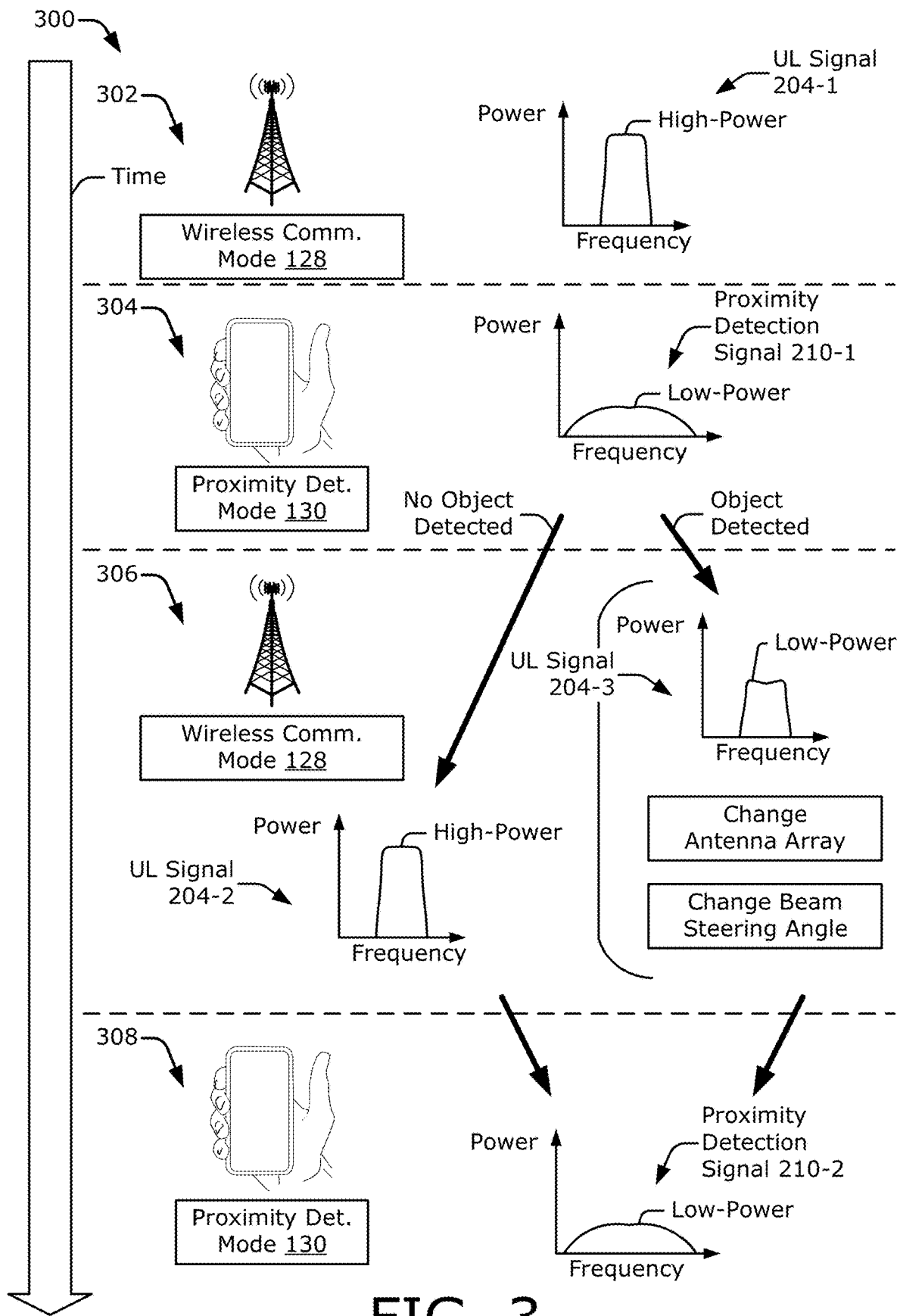
FIG. 3 illustrates an example sequence flow diagram for operating a computing device.

FIG. 3 illustrates an example sequence flow diagram 300 for operating the computing device 102, with time elapsing in a downward direction. Examples of the wireless communication mode 128 are shown at 302 and 306, and examples of the proximity detection mode 130 are shown at 304 and 308. The proximity detection modes 130 can occur at fixed time intervals, between active data cycles that occur during wireless communication, at predetermined times as set by the modem 122, during an unused random access channel (RACH) time slot, as part of an initialization process before wireless communications occur, responsive to detection of device movement, based on indications that the user may be proximate to the device (e.g., based on the wireless transceiver 120 observing a decrease in power in a downlink signal 206 or the application processor 108 determining that the user is interacting with the display 118 of the computing device 102), or during other times or in response to other events. In some situations, the computing device 102 measures a position of the object 208 during the proximity detection mode 130.

At 302, the computing device 102 transmits a high-power (e.g., normal) uplink signal 204-1 configured to provide sufficient range to a destination, such as a location of the base station 104. After transmitting the uplink signal 204-1, the computing device 102 transmits the proximity detection signal 210-1 at 304. As described above, the proximity detection signal 210 may enable the computing device 102 to detect an object 208 and determine if the object 208 is near the computing device 102. In this case, the proximity detection signal 210-1 is represented by a low-power wideband signal. Based on a detection, the wireless transceiver 120 can adjust a transmission parameter for a subsequent uplink signal 204 to account for MPE compliance guidelines.

The proximity detection mode 130 can also determine the range and/or angle to the object 208, thereby enabling transmission of the uplink signal 204 to comply with range-dependent and/or angle-dependent guidelines, such as a maximum power density. Because power density is proportional to transmit power and inversely proportional to range, an object 208 at a closer range is exposed to a higher power density than another object 208 at a farther range for a same transmit power level. Therefore, a similar power density at the object 208 can be achieved by increasing the transmit power level if the object 208 is at a farther range and decreasing the transmit power level if the object 208 is at a closer range The power density at the object 208 can also be dependent upon a beam steering angle (e.g., an angle of a main lobe of a radiation pattern). Directing the beam steering angle away from the angle to the object 208 can decrease the power density at the object 208, for instance. By controlling transmission power and/or the beam steering angle, the computing device 102 can customize transmission of the uplink signal 204 to enable the power density at the object 208 to be below the maximum power density. At the same time, because the range and/or the angle is known, the transmit power level can be increased to a level that facilitates wireless communication and comports with the compliance guideline.

At 306, the computing device 102 transmits a subsequent uplink signal 204. In the depicted example, a high-power uplink signal 204-2 is transmitted if an object 208 is not detected. Alternatively, a low-power uplink signal 204-3 is transmitted if the object 208 is detected. The low transmit power can be, for example, between approximately five and twenty decibel-milliwatts (dBm) less than the high-power signal at 302. In addition to or instead of changing a power of the subsequent uplink signal 204, the uplink signal 204-3 can be transmitted using a different antenna array within the computing device 102, using a different beam steering angle, using a different frequency, or using a different communication protocol (e.g., relative to the antenna array, the beam steering angle, the frequency, or the communication protocol used to transmit the uplink signal 204-1 at 302). Although not shown, the computing device 102 can alternatively skip the wireless communication mode at 306 and perform another proximity detection mode using another antenna array or a different transmit power level to detect objects 208 at various locations or distances around the computing device 102.

At 308, the computing device 102 transmit another proximity detection signal 210-2 to attempt to detect the object 208. By scheduling multiple proximity detection signals 210 over some time period, transmission of the uplink signal 204 can be dynamically adjusted based on a changing environment or movement by the object 208. Furthermore, appropriate adjustments can be made to balance communication performance with compliance or radiation requirements.

The sequence described above can also be applied to other antennas 124 within the computing device 102. The other antennas 124 can transmit multiple proximity detection signals 210 sequentially or in parallel. Components of the computing device 102 that enable wireless communication, proximity detection, and distortion compensation are further described with respect to FIG. 4. As noted above, it is optional for the computing device 102 to support the proximity detection mode 130. Thus, while proximity detection is described above, and certain references to the proximity detection mode 130 are included below, it will be understood that aspects described herein (for example, injecting a frequency-modulated signal into a receiver) may be performed in the absence of proximity detection or in a device that is not configured to detect proximity.

Figure 4:
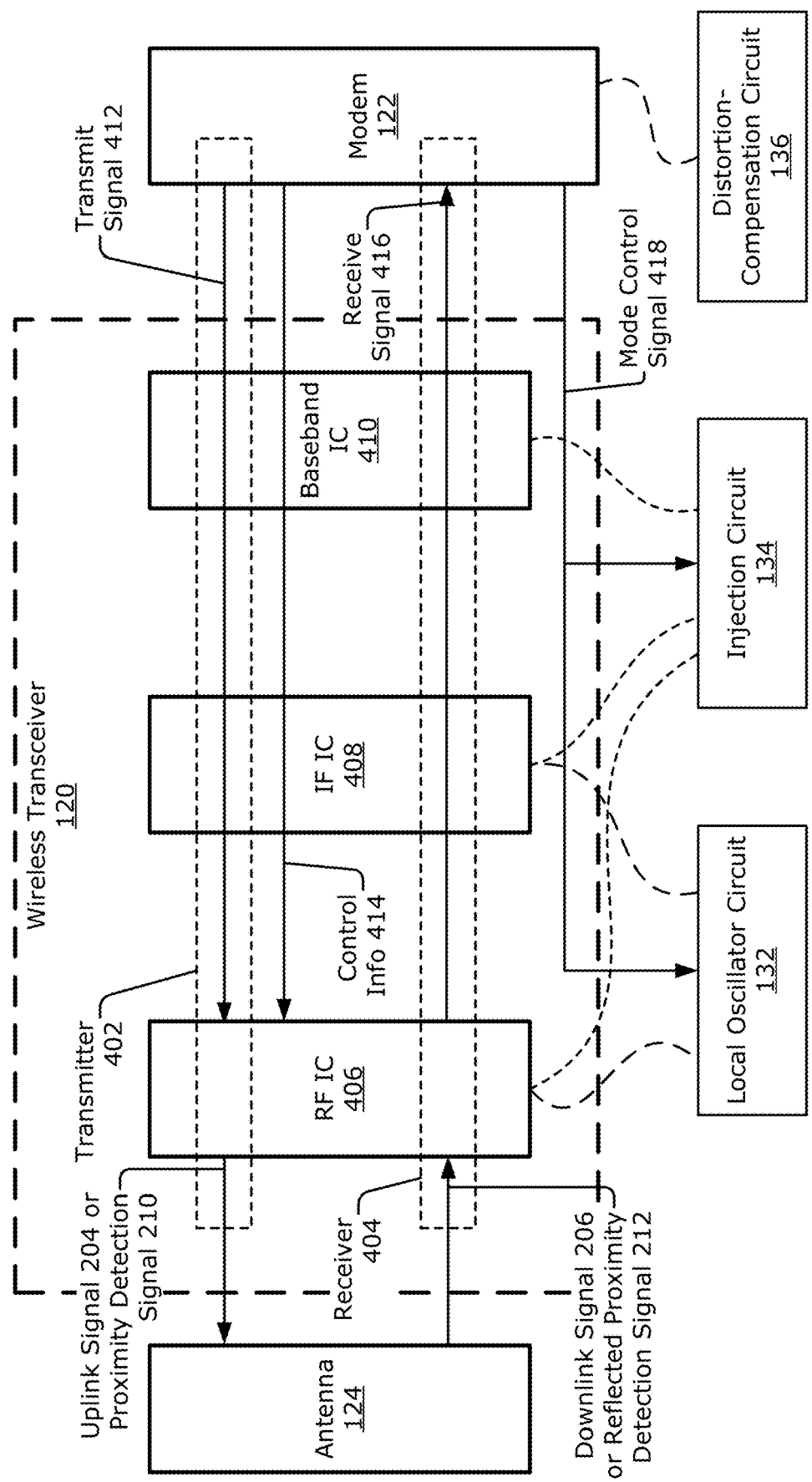
FIG. 4 illustrates examples of a wireless transceiver and modem for injecting a frequency-modulated signal into a receiver.

FIG. 4 illustrates examples of a wireless transceiver 120 and a modem 122 for injecting a frequency-modulated signal into a receiver. The wireless transceiver 120 and the modem 122 together implement a transmitter 402 and a receiver 404. The transmitter 402 and the receiver 404 can be coupled to a same antenna 124 or to different antennas 124.

In the depicted configuration, the wireless transceiver 120 represents a superheterodyne transceiver, which includes a radio-frequency integrated circuit 406 (RF IC 406), an intermediate-frequency integrated circuit 408 (IF IC 408), and a baseband integrated circuit 410 (baseband IC 410). In other implementations (not shown), the wireless transceiver 120 can be implemented as a direct-conversion transceiver (or zero-IF transceiver) with the radio-frequency integrated circuit 406 and the baseband integrated circuit 410 and without the intermediate-frequency integrated circuit 408. In some examples in which superheterodyne transceiver is implemented, the intermediate-frequency and baseband circuits are included in a single integrated circuit instead of in separate integrated circuits as illustrated in FIG. 4.

The radio-frequency integrated circuit 406 can represent a radio-frequency front-end of the wireless transceiver 120. In general, the radio-frequency integrated circuit 406 includes components that are designed to operate on analog signals having radio frequencies. The intermediate-frequency integrated circuit 408 includes components that are designed to operate on analog signals having intermediate frequencies. The baseband integrated circuit 410 includes components that are designed to operate at analog and/or digital signals having baseband frequencies. Components of the radio-frequency integrated circuit 406, the intermediate-frequency integrated circuit 408, and the baseband integrated circuit 410 can include amplifiers, phase shifters, filters, mixers, and switches. The baseband integrated circuit 410 can also include analog-to-digital converters and digital-to-analog converters.

The local oscillator circuit 132 can be integrated within the radio-frequency integrated circuit 406, the intermediate-frequency integrated circuit 408, or some combination thereof. The injection circuit 134 can be integrated within the radio-frequency integrated circuit 406, the intermediate-frequency integrated circuit 408, the baseband integrated circuit 410, or some combination thereof. In some implementations, the local oscillator circuit 132 and the injection circuit 134 are implemented within a same integrated circuit (e.g., within the radio-frequency integrated circuit 406 or the intermediate-frequency integrated circuit). In other implementations, the local oscillator circuit 132 and the injection circuit 134 are implemented across multiple integrated circuits. The distortion-compensation circuit 136 is implemented at least partially within the modem 122. In general, the injection circuit 134 and the distortion-compensation circuit 136 are at least partially disposed within a signal propagation path of the receiver 404.

The receiver 404 can include components, such as filters, that introduce distortion during the wireless communication mode 128 and/or the proximity detection mode 130. A first example filter includes a low-pass filter that is applied after a downconversion mixer to attenuate harmonic frequencies or intermodulation products. This filter can be implemented within the radio-frequency integrated circuit 406, the intermediate-frequency integrated circuit 408, or the baseband integrated circuit 410. A second example filter includes an anti-aliasing filter that is applied before an analog-to-digital converter to reduce aliasing. This filter can be implemented within the baseband integrated circuit 410. A third example filter can include a digital filter, such as a cascaded integrator-comb (CIC) filter, which can be implemented by the modem 122.

Figure 5:
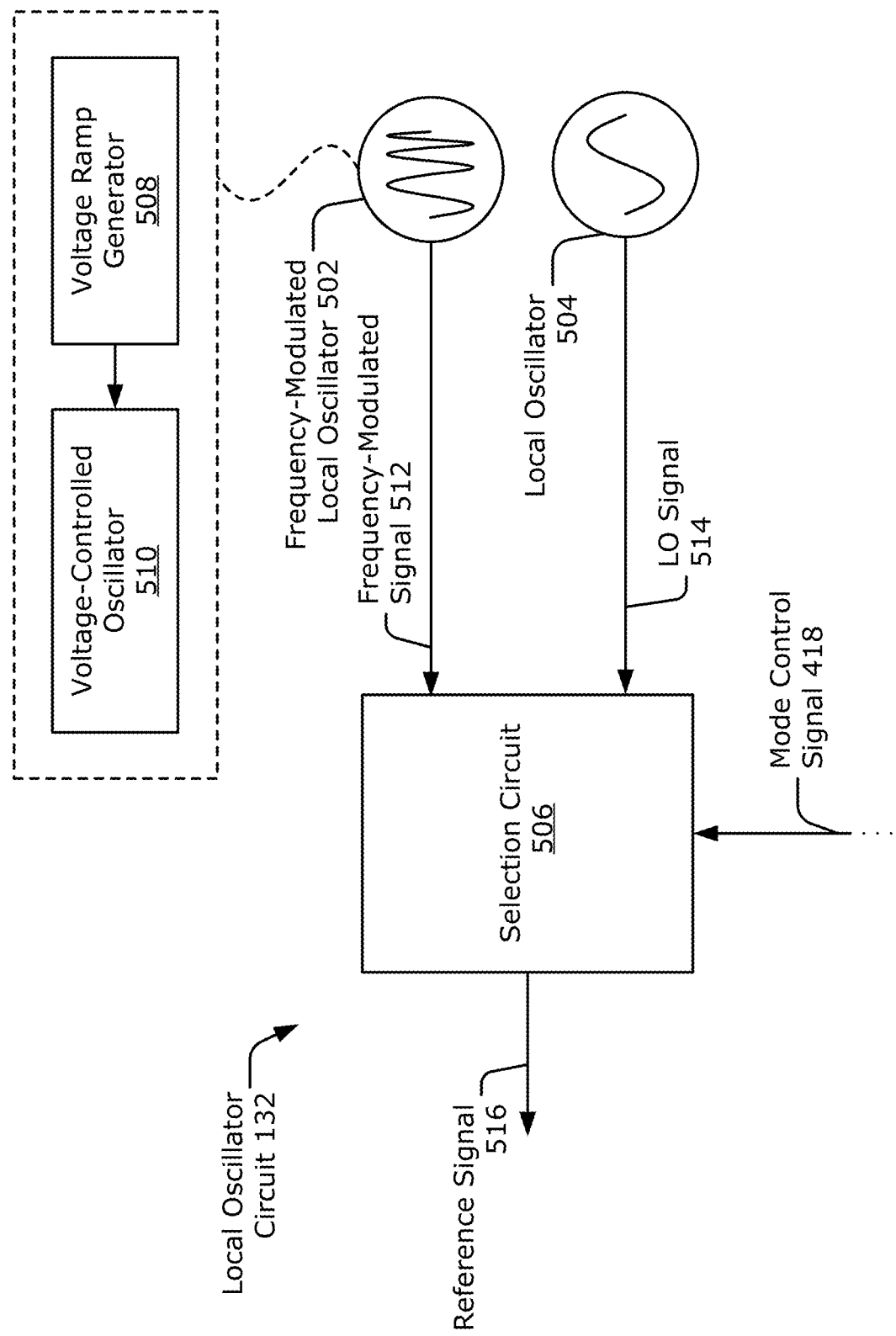
FIG. 5 illustrates an example local oscillator circuit for injecting a frequency-modulated signal into a receiver.

During the calibration mode 126, the local oscillator circuit 132 generates the frequency-modulated signal, as further described with respect to FIG. 5. The injection circuit 134 injects the frequency-modulated signal into the receiver 404 at some point along a signal propagation path. For example, the injection circuit 134 can inject the frequency-modulated signal into the radio-frequency integrated circuit 406, the intermediate-frequency integrated circuit 408, or the baseband integrated circuit 410. The receiver 404 propagates the frequency-modulated signal along the signal propagation path to the distortion-compensation circuit 136. The distortion-compensation circuit 136 measures the distortion within the receiver 404 based on the propagated frequency-modulated signal and determines an appropriate frequency response to compensate for the distortion. Due to the time-frequency duality associated with the frequency-modulated signal, the distortion-compensation circuit 136 can readily measure the frequency response of the receiver 404 based on time-domain samples of the propagated frequency-modulated signal.

During the wireless communication mode 128 and/or the proximity detection mode 130, the modem 122 generates a transmit signal 412, which can include communication data based on the wireless communication mode 128. The modem 122 also provides control information 414 to the radio-frequency integrated circuit 406. In some implementations, the modem 122 uses frequency-division multiplexing to enable both the transmit signal 412 and the control information 414 to be passed by a single communication path within the wireless transceiver 120. In other implementations, the transmit signal 412 and the control information 414 are passed to the radio-frequency integrated circuit 406 using separate communication paths.

The control information 414 includes at least one transmission parameter and/or at least one reception parameter that configures at least one component within the transmitter 402 or the receiver 404, respectively. As an example, the control information 414 specifies a gain of an amplifier (e.g., a power amplifier, a low-noise amplifier, or a variable-gain amplifier), phase-shift information for an analog phase shifter, an operational state of a switch that connects an antenna element of a selected antenna array 216 to the transmitter 402 or the receiver 404, and so forth. In some cases, the control information 414 enables the computing device 102 to satisfy the MPE limits, as described with respect to FIG. 3.

Depending on the operational mode of the wireless transceiver 120, the transmitter 402 uses the transmit signal 412 to generate the uplink signal 204 or the proximity detection signal 210. For example, the baseband integrated circuit 410 can convert the transmit signal 412 from a digital domain to an analog domain. The intermediate-frequency integrated circuit 408 can upconvert the transmit signal 412 from baseband frequencies to intermediate frequencies. The radio-frequency integrated circuit 406 can upconvert the transmit signal 412 from intermediate frequencies to radio frequencies, shift a phase of the transmit signal 412, and/or amplify the transmit signal 412 to generate the uplink signal 204 or the proximity detection signal 210. In some implementations, the local oscillator circuit 132 generates a local oscillator signal to enable upconversion of the transmit signal 412 during the wireless communication mode 128. The local oscillator circuit 132 can also generate a frequency-modulated signal to upconvert and modulate the transmit signal 412 during the proximity detection mode 130. The radio-frequency integrated circuit 406 provides the uplink signal 204 or the proximity detection signal 210 to the antenna 124 for transmission. The antenna 124 can represent a stand-alone antenna or an antenna element of an antenna array 216 (of FIG. 2-2).

The antenna 124 can additionally receive the downlink signal 206 during the wireless communication mode 128 or receive the reflected proximity detection signal 212 during the proximity detection mode 130. Depending on the operational mode of the wireless transceiver 120, the receiver 404 generates a receive signal 416 based on the downlink signal 206 or the reflected proximity detection signal 212. For example, the radio-frequency integrated circuit 406 amplifies the downlink signal 206 or the reflected proximity detection signal 212, shifts a phase of the downlink signal 206 or the reflected proximity detection signal 212, and/or downconverts the downlink signal 206 or the reflected proximity detection signal 212 from radio frequencies to intermediate (or baseband) frequencies to generate the receive signal 416. In some implementations, the local oscillator circuit 132 generates a local oscillator signal to enable downconversion of the downlink signal 206 during the wireless communication mode 128. During the proximity detection mode 130, the radio-frequency integrated circuit 406 performs a beating operation using the proximity detection signal 210 and the reflected proximity detection signal 212 to generate the receive signal 416.

The intermediate-frequency integrated circuit 408 downconverts the receive signal 416 from intermediate frequencies to baseband frequencies. The baseband integrated circuit 410 converts the receive signal 416 from the analog domain to the digital domain. The modem 122 analyzes a digital version of the receive signal 416 to perform other operations associated with the wireless communication mode 128 or the proximity detection mode 130. One of these operations can include applying a filter of the distortion-compensation circuit 136 to compensate for distortion artifacts introduced by the receiver 404.

The modem 122 also generates a mode control signal 418, which can appropriately configure the local oscillator circuit 132 and/or the injection circuit 134 for the active mode (e.g., the calibration mode 126, the wireless communication mode 128, or the proximity detection mode 130). The local oscillator circuit 132 is further described with respect to FIG. 5.

FIG. 5 illustrates an example local oscillator circuit 132 for injecting a frequency-modulated signal into the receiver 404 according to the calibration mode 126. In the depicted configuration, the local oscillator circuit 132 includes at least one frequency-modulated local oscillator 502, at least one local oscillator 504, and at least one selection circuit 506. The frequency-modulated local oscillator 502 can be implemented using a voltage ramp generator 508 and a voltage-controlled oscillator 510. As an example, the voltage-controlled oscillator 510 can be implemented using a wideband open-loop voltage controlled oscillator. By controlling an input voltage to the voltage-controlled oscillator 510, the voltage ramp generator 508 can provide a variety of different voltage ramps to enable the voltage-controlled oscillator 510 to generate a variety of different frequency-modulated signals 512 (e.g., a linear-frequency-modulated (LFM) signal, a sawtooth-frequency-modulated signal, a triangular-frequency-modulated signal, chirp, and so forth).

During the calibration mode 126, the frequency-modulated local oscillator 502 can generate the frequency-modulated signal 512 with a first bandwidth. In some implementations, the bandwidth is similar to a wireless communication bandwidth used during the wireless communication mode 128. During the proximity detection mode 130, the frequency-modulated local oscillator 502 can generate the frequency-modulated signal 512 with a second bandwidth, which can be larger than the first bandwidth. In general, larger bandwidths result in better range resolution for proximity detection.

The local oscillator 504 can include, for example, a quartz crystal, an inductor-capacitor (LC) oscillator, an oscillator transistor (e.g., a metal-oxide semiconductor field-effective transistor (MOSFET)), a transmission line, a diode, a piezoelectric oscillator, and so forth. A configuration of the local oscillator 504 can enable a target phase noise and quality factor to be achieved for the wireless communication mode 128. In general, the local oscillator 504 generates a local oscillator signal 514 with a steady (e.g., constant) frequency. Although not explicitly shown, the local oscillator circuit 132 can also include a phase lock loop or automatic gain control circuit. Either of these components can be coupled to the local oscillator 504 to enable the local oscillator 504 to oscillate at a steady frequency.

The selection circuit 506 can include a switch or a multiplexer that is controlled by the mode control signal 418. The selection circuit 506 generates a reference signal 516, which is passed to other components within the wireless transceiver 120 and/or the injection circuit 134. The reference signal 516 can be the frequency-modulated signal 512 or the local oscillator signal 514 based on the mode control signal 418. If the mode control signal 418 indicates that the calibration mode 126 or the proximity detection mode 130 is active, the selection circuit 506 provides the frequency-modulated signal 512 as the reference signal 516. Alternatively, if the mode control signal 418 indicates that the wireless communication mode 128 is active, the selection circuit 506 provides the local oscillator signal 514 as the reference signal 516. The selection circuit 506 enables the wireless transceiver 120 to quickly transition between the various modes. The injection circuit 134 is further described with respect to FIG. 6.

Figure 6:
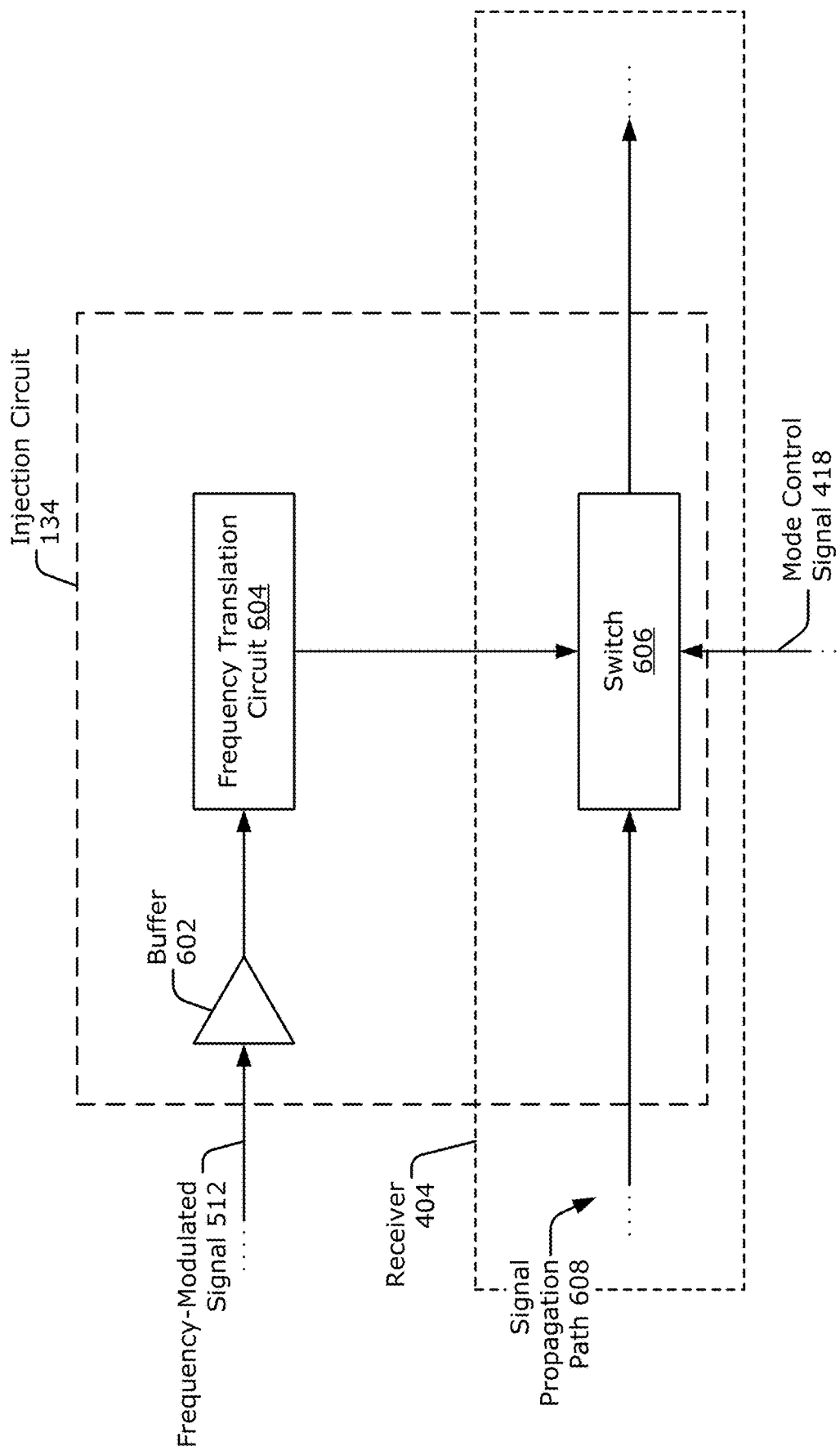
FIG. 6 illustrates example implementations of a local oscillator circuit and an injection circuit for injecting a frequency-modulated signal into a receiver.

FIG. 6 illustrates an example implementation of the injection circuit 134 for injecting the frequency-modulated signal 512 into the receiver 404. In the depicted configuration, the injection circuit 134 can optionally include at least one buffer 602 and/or at least one frequency translation circuit 604. The buffer 602 can provide isolation and/or amplification. The frequency translation circuit 604 can adjust a frequency of the frequency-modulated signal 512. In a first example implementation, the frequency translation circuit 604 can include a frequency multiplier, which increases the frequency of the frequency-modulated signal 512. For example, the frequency translation circuit 604 can increase the frequency of the frequency-modulated signal 512 by a factor of approximately 1.5 or 2. In a second example implementation, the frequency translation circuit 604 can include a frequency divider, which decreases the frequency of the frequency-modulated signal 512. For example, the frequency translation circuit 604 can decrease the frequency of the frequency-modulated signal 512 by a factor of approximately 2 or 4.

In general, the amount that the frequency translation circuit 604 increases or decreases the frequency of the frequency-modulated signal 512 depends on the point within the signal propagation path 608 that the frequency-modulated signal 512 is injected and a target wireless communication frequency band that is used during the wireless communication mode 128. For example, the frequency translation circuit 604 can increase the frequency of the frequency-modulated signal 512 for injection within a point of the signal propagation path 608 that is associated with radio frequencies. Additionally or alternatively, the frequency translation circuit 604 can decrease the frequency of the frequency-modulated signal 512 for injection within a point of the signal propagation path 608 that is associated with intermediate or baseband frequencies. In some cases in which the frequency-modulated signal 512 is generated with the desired frequencies, the injection circuit 134 can bypass or be implemented without the frequency translation circuit 604.

The injection circuit 134 also includes at least one switch 606. The switch 606 is disposed within a signal propagation path 608 of the receiver 404. The switch 606 enables the injection circuit 134 to connect the local oscillator circuit 132 to the signal propagation path 608 of the receiver 404 during the calibration mode 126. In this way, the injection circuit 134 can inject the frequency-modulated signal 512 into the signal propagation path 608. The switch 606 also enables the injection circuit 134 to disconnect the local oscillator circuit 132 from the signal propagation path 608 during the wireless communication mode 128 and the proximity detection mode 130. In this case, the switch 606 enables the receiver 404 to propagate the downlink signal 206, the reflected proximity detection signal 212, or the receive signal 416 along the signal propagation path 608. A configuration of the switch 606 is set according to the mode control signal 418, as further described with respect to FIGS. 8-1 to 8-3. An example implementation of the injection circuit 134 within the wireless transceiver 120 is further described with respect to FIG. 7.

Figure 7:
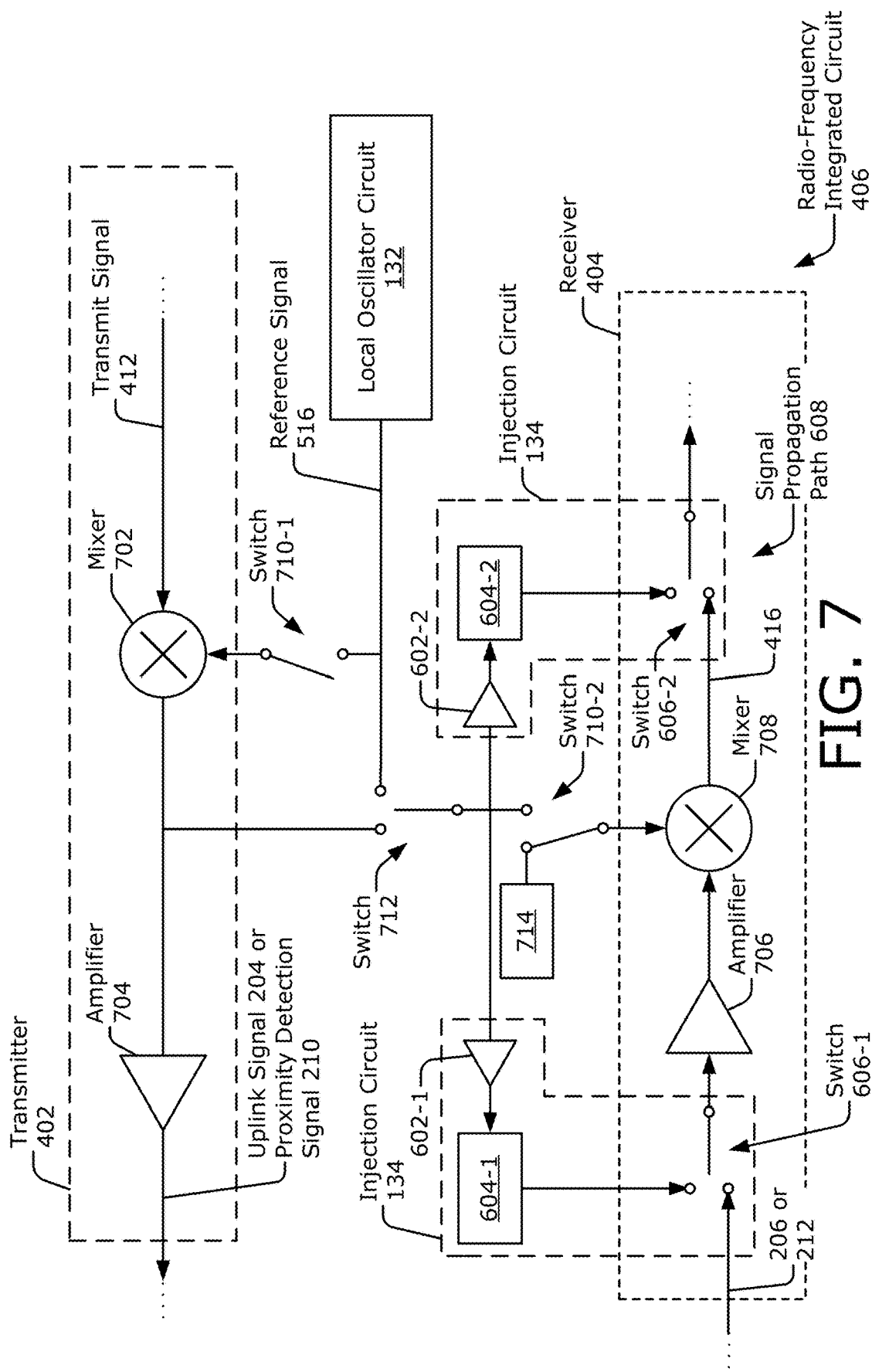
FIG. 7 illustrates an example implementation of a radio-frequency integrated circuit for injecting the frequency-modulated signal into a receiver.

FIG. 7 illustrates an example implementation of a radio-frequency integrated circuit 406 for injecting the frequency-modulated signal 512 into the receiver 404. In the depicted configuration, the radio-frequency integrated circuit 406 includes a portion of the transmitter 402, a portion of the receiver 404, the local oscillator circuit 132, and the injection circuit 134. The radio-frequency integrated circuit 406 also includes a mixer 702 (e.g., an upconversion mixer) and an amplifier 704 (e.g., a power amplifier), which are implemented as part of the transmitter 402. Additionally, the radio-frequency integrated circuit 406 includes an amplifier 706 (e.g., a low-noise amplifier) and a mixer 708 (e.g., a downconversion mixer), which are implemented as part of the receiver 404. Both the amplifier 706 and the mixer 708 are disposed within the signal propagation path 608 of the receiver 404.

During the wireless communication mode 128 or the proximity detection mode 130, the radio-frequency integrated circuit 406 can couple the local oscillator circuit 132 to the transmitter 402 and/or the receiver 404 using switches 710-1, 710-2, and 712. During the calibration mode 126, the radio-frequency integrated circuit 406 can couple the local oscillator circuit 132 to the receiver 404 using the switch 712 and either one of switches 606-1 or 606-2. The switch 710-1 is coupled between the local oscillator circuit 132 and the mixer 702. The switch 712 is coupled to the local oscillator circuit 132, the transmitter 402 (e.g., at an output of the mixer 702), the switch 710-2, and the injection circuit 134. The switch 710-2 is coupled to the switch 712, the injection circuit 134, the mixer 708, and a continuous-wave tone generator 714 of the radio-frequency integrated circuit 406. In some implementations, the continuous-wave tone generator 714 is implemented as a phase-locked loop, which can be part of the local oscillator circuit 132.

The injection circuit 134 includes a first buffer 602-1, a first frequency translation circuit 604-1, and a first switch 606-1. The switch 606-1 is coupled to an input of the amplifier 706. With these components, the injection circuit 134 can inject the frequency-modulated signal 512 into a point along the signal propagation path 608 that is associated with radio frequencies. The injection circuit 134 can also optionally or alternatively include a second buffer 602-2, a second frequency translation circuit 714-2, and a second switch 606-2. The second switch 606-2 is coupled to an output of the mixer 708. With these components, the injection circuit 134 can inject the frequency-modulated signal 512 into a point along the signal propagation path 608 that is associated with intermediate frequencies in a superheterodyne receiver or baseband frequencies in a direct-conversion receiver. In a superheterodyne receiver, the frequency-modulated signal 512 may also or alternatively be injected at baseband (e.g., after a second downconversion mixer, not illustrated).

Figures 1, 8:
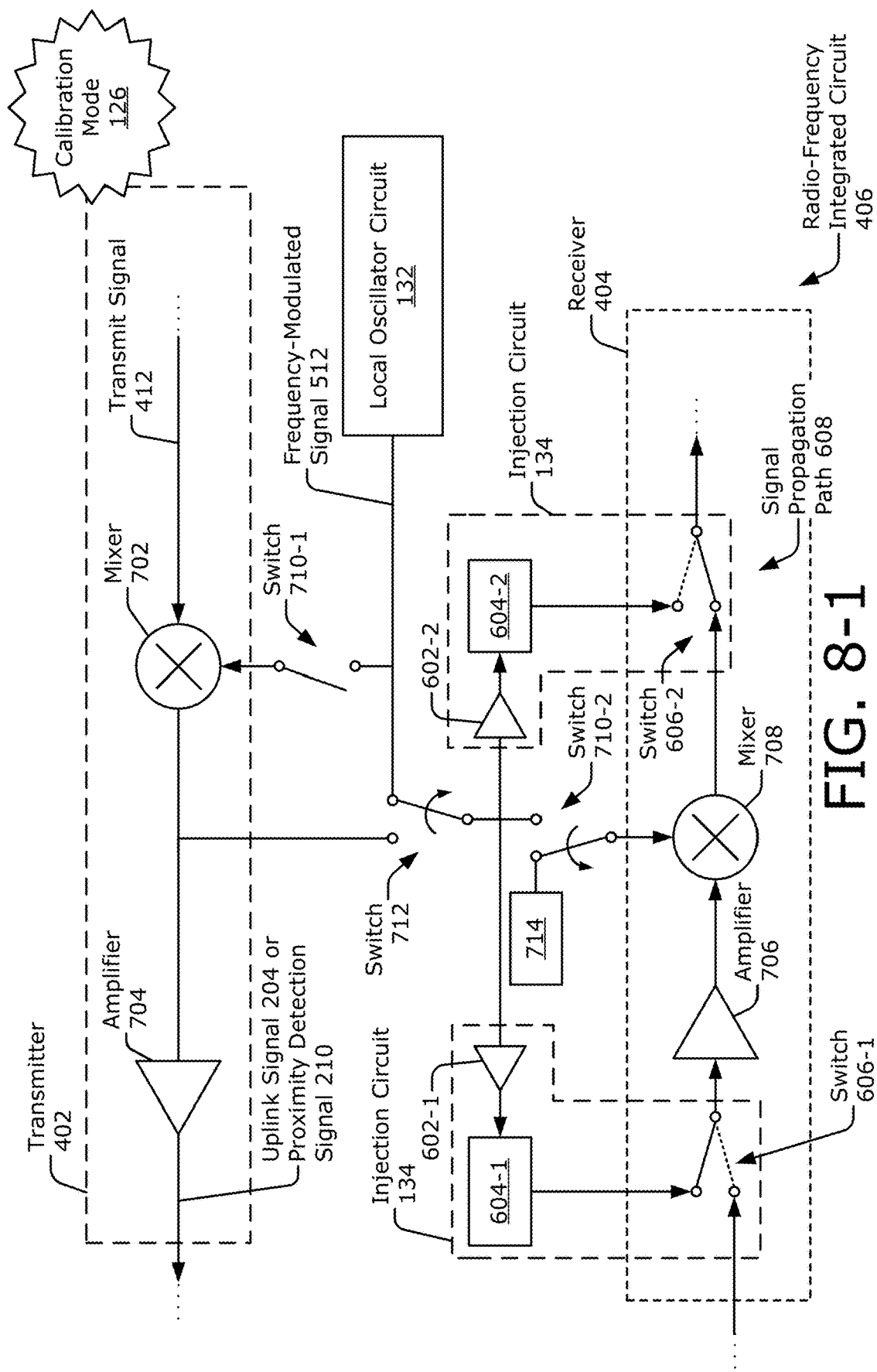
Figures 2, 8:
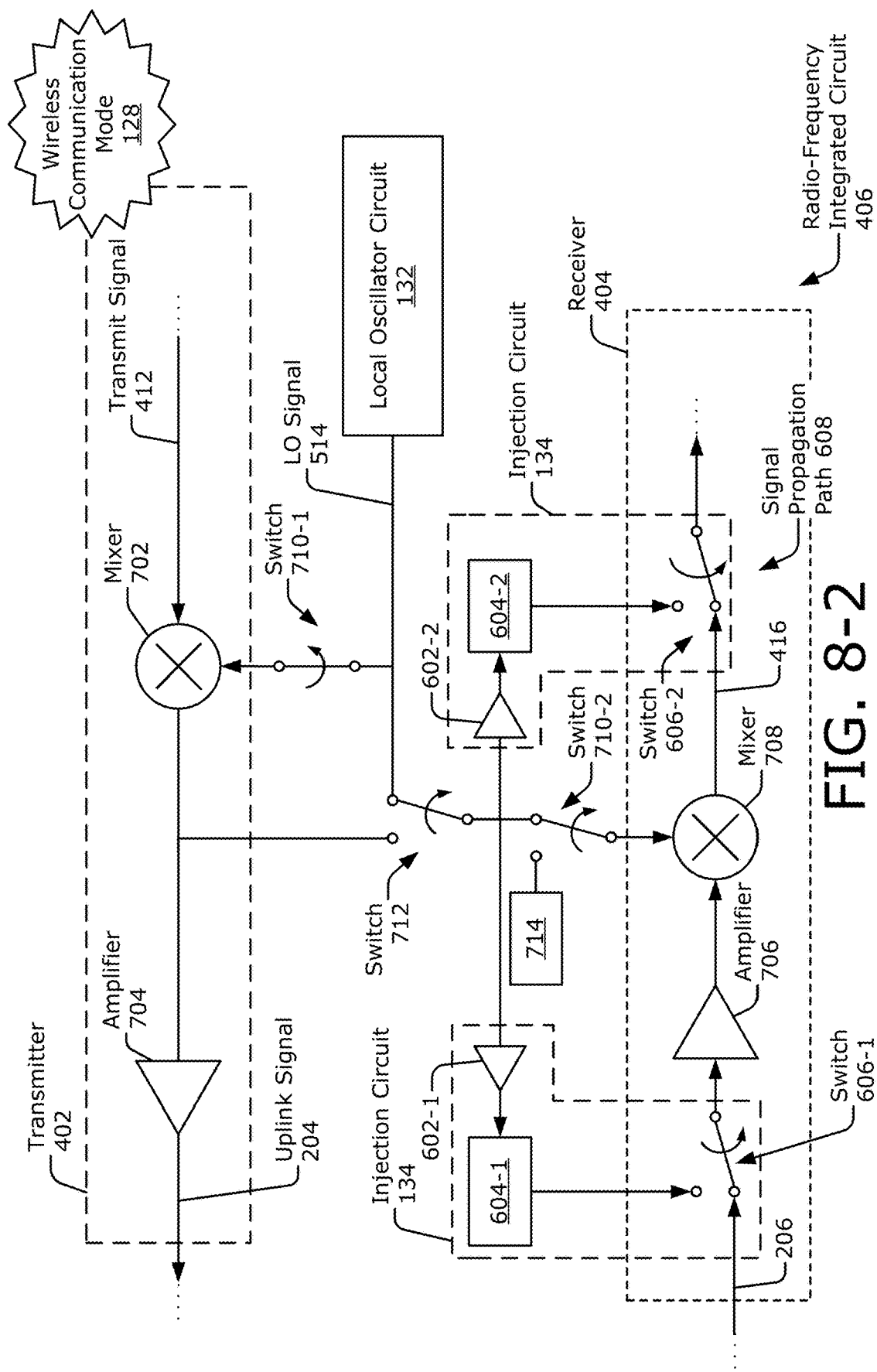
Figures 3, 8:
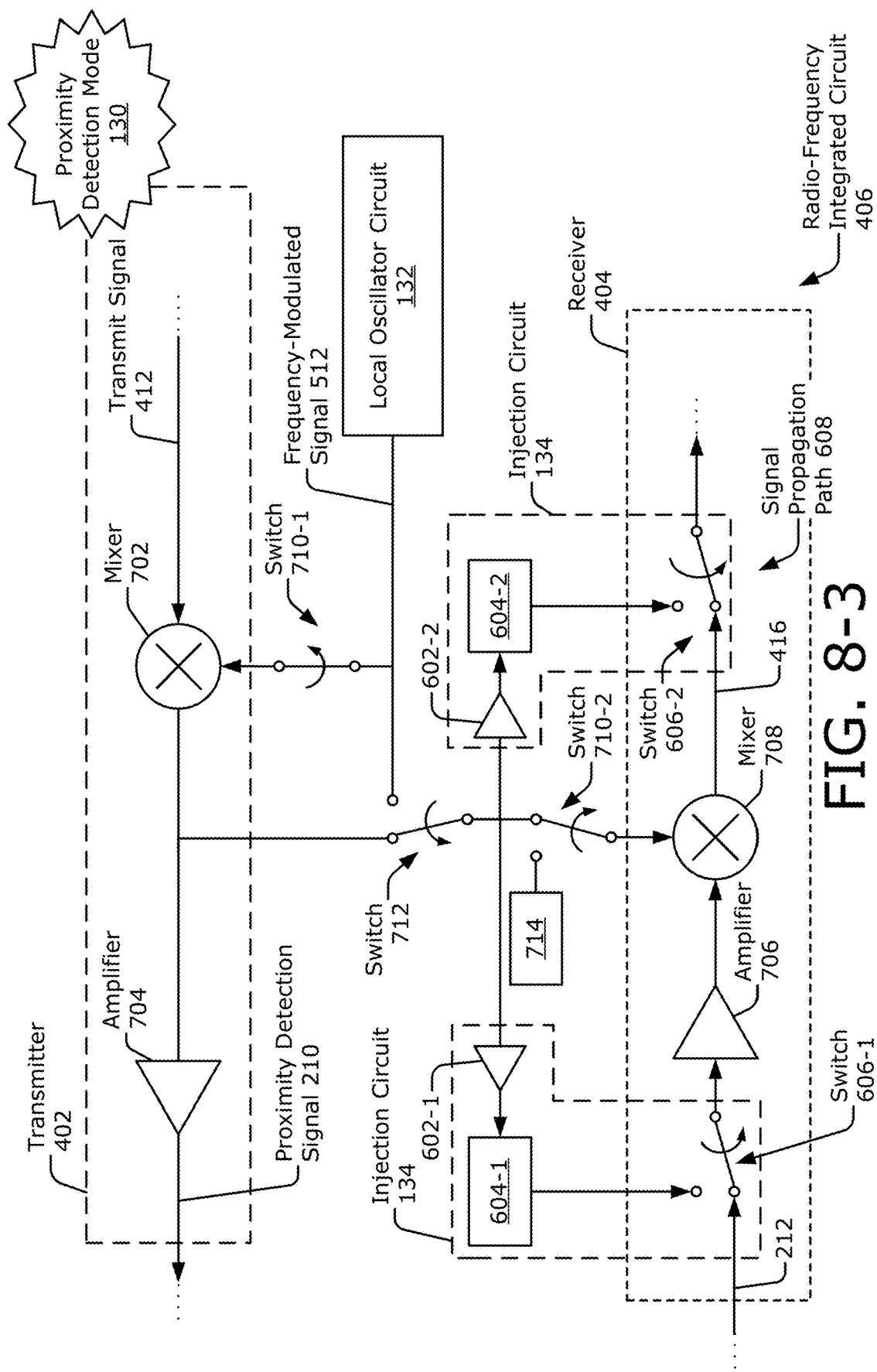

Using the switches 710-1, 710-2, and 712 of the radio-frequency integrated circuit 406 and the switches 606-1 and 606-2 of the injection circuit 134, the wireless transceiver 120 can support the calibration mode 126 as described with respect to FIG. 8-1, the wireless communication mode 128 as described with respect to FIG. 8-2, and/or the proximity detection mode 130 as described with respect to FIG. 8-3. The example radio-frequency integrated circuit 406 depicted in FIG. 7 supports the calibration mode 126, the wireless communication mode 128, and the proximity detection mode 130. Other implementations of the radio-frequency integrated circuit 406 may support the calibration mode 126 and the wireless communication mode 128 and may not support the proximity detection mode 130. In this case, the radio-frequency integrated circuit 406 may not include the switch 712. As such, the switch 710-2 and the injection circuit 134 are coupled to the switch 710-1 and the local oscillator circuit 132.

FIG. 8-1 illustrates an example configuration of the radio-frequency integrated circuit 406 during the calibration mode 126. In the depicted configuration, the local oscillator circuit 132 generates the frequency-modulated signal 512 as the reference signal 516. The switch 710-1 is in an open state to disconnect the local oscillator circuit 132 from the mixer 702. The switch 712 is in a first state to connect the local oscillator circuit 132 to the injection circuit 134. The switch 710-2 is in a first state to connect the continuous-wave tone generator 714 to the mixer 708.

At different times, the injection circuit 134 can connect the local oscillator circuit 132 to different points along the signal propagation path 608. For example, at a first time interval during the calibration mode 126, the switch 606-1 is in a first state that connects the local oscillator circuit 132 to the input of the amplifier 706. Also, the switch 606-2 is in a second state that disconnects the local oscillator circuit 132 from the output of the mixer 708 and connects the output of the mixer 708 to another component (not shown) within the signal propagation path 608. The first state of the switch 606-1 and the second state of the switch 606-2 are represented by solid lines to indicate that these states occur during a same time interval. The states of the switches 606-1, 606-2, and 712 enable the frequency-modulated signal 512 to be injected at the input of the amplifier 706 and propagate to the modem 122.

At a second time interval during the calibration mode 126, the switch 606-1 is in a second state that disconnects the local oscillator circuit 132 from the amplifier 706. Also, the switch 606-2 is in a first state that connects the local oscillator circuit 132 to the output of the mixer 708. The second state of the switch 606-1 and the first state of the switch 606-2 are represented by dashed lines to indicate that these states occur during a same time interval. The states of the switches 606-1, 606-2, and 712 enable the frequency-modulated signal 512 to be injected at the output of the mixer 708 and propagate to the modem 122.

FIG. 8-2 illustrates an example configuration of the radio-frequency integrated circuit 406 during the wireless communication mode 128. In the depicted configuration, the local oscillator circuit 132 generates the local oscillator signal 514 as the reference signal 516. During transmission, the switch 710-1 is in a closed state to connect the local oscillator circuit 132 to the mixer 702. This enables the transmitter 402 to generate the uplink signal 204 by upconverting the transmit signal 412 to radio frequencies using the local oscillator signal 514.

During reception, the switch 712 is in the first state to connect the local oscillator circuit 132 to the switch 710-2. The switch 710-2 is in a second state to connect the switch 712 to the mixer 708. This enables the receiver 404 to generate the receive signal 416 by downconverting the downlink signal 206 to intermediate frequencies using the local oscillator signal 514. The switches 606-1 and 606-2 are in the second state to enable propagation of the downlink signal 206 and the receive signal 416 along the signal propagation path 608 to the modem 122.

FIG. 8-3 illustrates an example configuration of the radio-frequency integrated circuit 406 during the proximity detection mode 130. In the depicted configuration, the local oscillator circuit 132 generates the frequency-modulated signal 512 as the reference signal 516. The switch 710-1 is in the closed state to connect the local oscillator circuit 132 to the mixer 702. This enables the transmitter 402 to generate the proximity detection signal 210 by upconverting the transmit signal 412 to radio frequencies and modulating the transmit signal 412 using the frequency-modulated signal 512.

The switch 712 is in a second state to connect the transmitter 402 to the switch 710-2. The switch 710-2 is in the second state to connect the switch 712 to the mixer 708. This enables the receiver 404 to generate the receive signal 416 by downconverting and demodulating the reflected proximity detection signal 212 using the proximity detection signal 210. The switches 606-1 and 606-2 are in the second state to enable propagation of the reflected proximity detection signal 212 and the receive signal 416 along the signal propagation path 608 to the modem 122.

Although examples of the local oscillator circuit 132 and the injection circuit 134 are shown to be implemented within the radio-frequency integrated circuit 406 in FIGS. 7 to 8-3, other implementations of the wireless transceiver 120 can include the local oscillator circuit 132 and/or the injection circuit 134 implemented within the intermediate-frequency integrated circuit 408 and/or the baseband integrated circuit 410. In these implementations, the frequency-modulated signal 512 can be injected at other points along the signal propagation path 608, including points associated with intermediate frequencies and/or baseband frequencies.

FIG. 9 is a flow diagram illustrating an example process 900 for injecting a frequency-modulated signal into a receiver. The process 900 is described in the form of a set of blocks 902-910 that specify operations that can be performed. However, operations are not necessarily limited to the order shown in FIG. 9 or described herein, for the operations may be implemented in alternative orders or in fully or partially overlapping manners. Also, more, fewer, and/or different operations may be implemented to perform the process 900, or an alternative process. Operations represented by the illustrated blocks of the process 900 may be performed by a wireless transceiver 120 and a modem 122 (e.g., of FIG. 1 or 4). More specifically, the operations of the process 900 may be performed, at least in part, by a local oscillator circuit 132, as shown in FIG. 5, and an injection circuit 134, as shown in FIG. 6.

At 902, the local oscillator circuit is disconnected from a mixer of a receiver based on a calibration mode. For example, the switch 710-2 disconnects the local oscillator circuit 132 from the mixer 708 of the receiver 404 based on the mode control signal 418 indicating that the calibration mode 126 is active. The switch 710-1 can also disconnect the local oscillator circuit 132 from the mixer 702 of the transmitter 402.

At 904, the local oscillator circuit is connected to an input or an output of a component that is disposed within a signal propagation path of the receiver based on the calibration mode. For example, the switch 712 and either the switch 606-1 or 606-2 connects the local oscillator circuit 132 to an input or an output of a component that is disposed within the signal propagation path 608 of the receiver 404. In the example shown in FIG. 8-1, the local oscillator circuit 132 can be connected to an input of the amplifier 706 or an output of the mixer 708.

At 906, a frequency-modulated signal is generated by the local oscillator circuit in accordance with the calibration mode. For example, the local oscillator circuit 132 generates the frequency-modulated signal 512 in accordance with the calibration mode 126, as shown in FIG. 5. In some examples, the frequency-modulated signal 512 represents a linear-frequency-modulated signal.

At 908, the frequency-modulated signal is injected into the signal propagation path of the receiver. For example, the injection circuit 134 injects the frequency-modulated signal 512 into the signal propagation path of the receiver 404, as shown in FIG. 8-1.

Some aspects are described below.

Aspect 1: An apparatus comprising:
a receiver comprising a signal propagation path;
a local oscillator circuit configured to generate a frequency-modulated signal; and an injection circuit coupled to the receiver and the local oscillator circuit, the injection circuit configured to selectively:
  connect the local oscillator circuit to the signal propagation path of the receiver to inject the frequency-modulated signal into the signal propagation path of the receiver; and
  disconnect the local oscillator circuit from the signal propagation path of the receiver.

Aspect 2: The apparatus of aspect 1, further comprising:
a radio-frequency integrated circuit comprising the local oscillator circuit, the injection circuit, and at least a portion of the signal propagation path of the receiver.

Aspect 3: The apparatus of aspect 2, wherein:
the radio-frequency integrated circuit comprises an amplifier; and
the injection circuit is configured to selectively:
  connect the local oscillator circuit to an input of the amplifier to inject the frequency-modulated signal into the signal propagation path of the receiver; and
  disconnect the local oscillator circuit from the input of the amplifier.

Aspect 4: The apparatus of aspect 2 or 3, wherein:
the radio-frequency integrated circuit comprises a mixer; and
the injection circuit is configured to selectively:
  connect the local oscillator circuit to an output of the mixer to inject the frequency-modulated signal into the signal propagation path of the receiver; and
  disconnect the local oscillator circuit from the output of the mixer.

Aspect 5: The apparatus of any one of aspects 2-4, wherein:
the radio-frequency integrated circuit comprises a first component and second component; and
the injection circuit is configured to selectively:
  connect the local oscillator circuit to the first component to inject the frequency-modulated signal into the signal propagation path of the receiver;
  connect the local oscillator circuit to the second component to inject the frequency-modulated signal into the signal propagation path of the receiver; and
  disconnect the local oscillator circuit from the first component and the second component.

Aspect 6: The apparatus of any previous aspect, wherein the injection circuit comprises:
at least one frequency translation circuit coupled to the local oscillator circuit, the at least one frequency translation circuit configured to increase or decrease frequencies of the frequency-modulated signal; and
at least one switch coupled to the at least one frequency translation circuit and disposed within the signal propagation path, the at least one switch configured to selectively:
  connect the at least one frequency translation circuit to a component within the signal propagation path of the receiver; and
  disconnect the at least one frequency translation circuit from the component and connect the component to another component within the signal propagation path of the receiver.

Aspect 7: The apparatus of aspect 6, wherein the injection circuit comprises at least one buffer coupled between the local oscillator circuit and the at least one frequency translation circuit.

Aspect 8: The apparatus of any previous aspect, wherein the receiver is configured to propagate the frequency-modulated signal along the signal propagation path in accordance with a calibration mode.

Aspect 9: The apparatus of aspect 8, wherein:
the receiver comprises a distortion-compensation circuit disposed within the signal propagation path, the distortion-compensation circuit configured to:
  accept the propagated frequency-modulated signal;
  determine a frequency response of the receiver based on the propagated frequency-modulated signal; and
  apply a filter having a frequency response that at least partially compensates for a distortion artifact present within the frequency response of the receiver.

Aspect 10: The apparatus of aspect 9, wherein:
the receiver comprises at least one filter that is disposed within the signal propagation path and coupled between the injection circuit and the distortion-compensation circuit;
the at least one filter has a frequency response with ripples in a passband or droop at an edge of the passband; and
the distortion artifact is associated with the ripples in the passband or the droop at the edge of the passband.

Aspect 11: The apparatus of any previous aspect, wherein the frequency-modulated signal comprises a linear-frequency-modulated signal.

Aspect 12: The apparatus of any previous aspect, wherein:
the local oscillator circuit is configured to selectively:
  generate the frequency-modulated signal based on a calibration mode; and
  generate a local oscillator signal based on a wireless communication mode; and
the receiver is configured to:
  receive a downlink signal based on the wireless communication mode; and
  downconvert a frequency of the downlink signal using the local oscillator signal.

Aspect 13: The apparatus of aspect 12, wherein the local oscillator circuit comprises:
a voltage ramp generator and a voltage-controlled oscillator jointly configured to generate the frequency-modulated signal;
a local oscillator configured to generate the local oscillator signal; and
a selection circuit configured to:
  provide the frequency-modulated signal to the injection circuit based on the calibration mode; and
  provide the local oscillator signal to the receiver based on the wireless communication mode.

Aspect 14: The apparatus of any previous aspect, further comprising:
a transmitter coupled to the local oscillator circuit, wherein:
the frequency-modulated signal comprises a first frequency-modulated signal;
the local oscillator circuit is configured to selectively:
  generate the first frequency-modulated signal based on a calibration mode; and
  generate a second frequency-modulated signal based on a proximity detection mode; and
the transmitter is configured to generate, based on the proximity detection mode, a proximity detection signal by performing frequency upconversion using the second frequency-modulated signal.

Aspect 15: The apparatus of aspect 14, wherein:
the first frequency-modulated signal has a first bandwidth; and the second frequency-modulated signal has a second bandwidth that is larger than the first bandwidth.

Aspect 16: An apparatus comprising:
means for receiving a wireless communication signal during a wireless communication mode, the means for receiving including a signal propagation path;
means for generating a frequency-modulated signal during a calibration mode; and
means for injecting the frequency-modulated signal within the signal propagation path during the calibration mode.

Aspect 17: The apparatus of aspect 16, wherein the means for injecting the frequency-modulated signal comprises means for adjusting a frequency of the frequency-modulated signal.

Aspect 18: The apparatus of aspect 17, wherein the means for adjusting the frequency of the frequency-modulated signal comprises means for increasing the frequency of the frequency-modulated signal.

Aspect 19: The apparatus of aspect 17 or 18, wherein the means for adjusting the frequency of the frequency-modulated signal comprises means for decreasing the frequency of the frequency-modulated signal.

Aspect 20: A method comprising:
disconnecting a local oscillator circuit from a mixer of a receiver based on the calibration mode;
connecting the local oscillator circuit to an input or an output of a component that is disposed within a signal propagation path of the receiver based on the calibration mode;
generating, by the local oscillator circuit, a frequency-modulated signal in accordance with the calibration mode; and
injecting the frequency-modulated signal into the signal propagation path of the receiver.

Aspect 21: The method of aspect 20, wherein the frequency-modulated signal exhibits a linear characteristic between a frequency of the frequency-modulated signal and time.

Aspect 22: The method of aspect 20 or 21, further comprising:
disconnecting the local oscillator circuit from the input or the output of the component based on a proximity detection mode;
connecting the local oscillator circuit to a mixer of a transmitter based on the proximity detection mode;
generating, by the local oscillator circuit, another frequency-modulated signal in accordance with the proximity detection mode; and
generating a proximity detection signal by upconverting a transmit signal using the other frequency-modulated signal and the mixer of the transmitter.

Aspect 23: The method of aspect 22, further comprising:
connecting an output of the mixer of the transmitter to a mixer of the receiver based on the proximity detection mode; and
connecting the input or the output of the component to another component that is disposed within the signal propagation path of the receiver based on the proximity detection mode.

Aspect 24: The method of any one of aspects 20-23, further comprising:
disconnecting the local oscillator circuit from the input or the output of the component based on a wireless communication mode;
connecting the input or the output of the component to another component that is disposed within the signal propagation path of the receiver based on the wireless communication mode;
connecting the local oscillator circuit to a mixer of the receiver based on the wireless communication mode; and
generating, by the local oscillator circuit, a local oscillation signal in accordance with the wireless communication mode.

Aspect 25: An apparatus comprising:
a modem configured to generate a mode control signal; and
a wireless transceiver coupled to the modem and comprising a portion of a signal propagation path of a receiver, the wireless transceiver configured to:
accept the mode control signal;
receive a downlink signal using the portion of the signal propagation path of the receiver based on the mode control signal indicating a wireless communication mode; and
inject a frequency-modulated signal into the signal propagation path of the receiver based on the mode control signal indicating a calibration mode.

Aspect 26: The apparatus of aspect 25, wherein the wireless transceiver is configured to inject the frequency-modulated signal at a point within the signal propagation path that is associated with radio frequencies.

Aspect 27: The apparatus of aspect 25 or 26, wherein the wireless transceiver is configured to inject the frequency-modulated signal at a point within the signal propagation path that is associated with intermediate frequencies.

Aspect 28: The apparatus of any one of aspects 25-27, wherein the wireless transceiver is configured to inject the frequency-modulated signal at a point within the signal propagation path that is associated with baseband frequencies.

Aspect 29: The apparatus of any one of aspects 25-28, wherein the frequency-modulated signal comprises a linear-frequency-modulated signal.

Aspect 30: The apparatus of any one of aspects 25-29, wherein:
the wireless transceiver is configured to propagate the frequency-modulated signal through the portion of the signal propagation path of the receiver based on the calibration mode; and
the modem comprises:
another portion of the signal propagation path of the receiver; and
a distortion-compensation circuit disposed within the other portion of the signal propagation path, the distortion-compensation circuit configured to:
accept the propagated frequency-modulated signal;
determine a frequency response of the receiver based on the propagated frequency-modulated signal; and
filter the downlink signal using a filter with a frequency response that at least partially compensates for a distortion artifact present within the frequency response of the receiver.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
    a receiver comprising a signal propagation path and a distortion-compensation circuit disposed within the signal propagation path;
    a local oscillator circuit configured to generate a frequency-modulated signal; and
    an injection circuit coupled to the receiver and the local oscillator circuit, the injection circuit configured to selectively:
        connect the local oscillator circuit to the signal propagation path of the receiver to inject the frequency-modulated signal into the signal propagation path of the receiver; and
        disconnect the local oscillator circuit from the signal propagation path of the receiver,
    wherein the receiver is configured to propagate the frequency-modulated signal along the signal propagation path in accordance with a calibration mode, and
    wherein the distortion-compensation circuit is configured to:
        accept the propagated frequency-modulated signal;
        determine a frequency response of the receiver based on the propagated frequency-modulated signal; and
        apply a filter having a frequency response that at least partially compensates for a distortion artifact present within the frequency response of the receiver.

2. The apparatus of claim 1, further comprising:
    a radio-frequency integrated circuit comprising the local oscillator circuit, the injection circuit, and at least a portion of the signal propagation path of the receiver.

3. The apparatus of claim 2, wherein:
    the radio-frequency integrated circuit comprises an amplifier; and
    the injection circuit is configured to selectively:
        connect the local oscillator circuit to an input of the amplifier to inject the frequency-modulated signal into the signal propagation path of the receiver; and
        disconnect the local oscillator circuit from the input of the amplifier.

4. The apparatus of claim 2, wherein:
    the radio-frequency integrated circuit comprises a mixer; and
    the injection circuit is configured to selectively:
        connect the local oscillator circuit to an output of the mixer to inject the frequency-modulated signal into the signal propagation path of the receiver; and
        disconnect the local oscillator circuit from the output of the mixer.

5. The apparatus of claim 2, wherein:
    the radio-frequency integrated circuit comprises a first component and second component; and
    the injection circuit is configured to selectively:
        connect the local oscillator circuit to the first component to inject the frequency-modulated signal into the signal propagation path of the receiver;
        connect the local oscillator circuit to the second component to inject the frequency-modulated signal into the signal propagation path of the receiver; and
        disconnect the local oscillator circuit from the first component and the second component.

6. The apparatus of claim 1, wherein the injection circuit comprises:
    at least one frequency translation circuit coupled to the local oscillator circuit, the at least one frequency translation circuit configured to increase or decrease frequencies of the frequency-modulated signal; and
    at least one switch coupled to the at least one frequency translation circuit and disposed within the signal propagation path, the at least one switch configured to selectively:
        connect the at least one frequency translation circuit to a component within the signal propagation path of the receiver; and
        disconnect the at least one frequency translation circuit from the component and connect the component to another component within the signal propagation path of the receiver.

7. The apparatus of claim 6, wherein the injection circuit comprises at least one buffer coupled between the local oscillator circuit and the at least one frequency translation circuit.

8. The apparatus of claim 1, wherein:
    the receiver comprises at least one filter that is disposed within the signal propagation path and coupled between the injection circuit and the distortion-compensation circuit;
    the at least one filter has a frequency response with ripples in a passband or droop at an edge of the passband; and
    the distortion artifact is associated with the ripples in the passband or the droop at the edge of the passband.

9. The apparatus of claim 1, wherein the frequency-modulated signal comprises a linear-frequency-modulated signal.

10. The apparatus of claim 1, wherein:
    the local oscillator circuit is configured to selectively:
        generate the frequency-modulated signal based on the calibration mode; and
        generate a local oscillator signal based on a wireless communication mode; and
    the receiver is configured to:
        receive a downlink signal based on the wireless communication mode; and
        downconvert a frequency of the downlink signal using the local oscillator signal.

11. The apparatus of claim 10, wherein the local oscillator circuit comprises:
    a voltage ramp generator and a voltage-controlled oscillator jointly configured to generate the frequency-modulated signal;
    a local oscillator configured to generate the local oscillator signal; and
    a selection circuit configured to:
        provide the frequency-modulated signal to the injection circuit based on the calibration mode; and provide the local oscillator signal to the receiver based on the wireless communication mode.

12. The apparatus of claim 1, further comprising:
a transmitter coupled to the local oscillator circuit, wherein:
the frequency-modulated signal comprises a first frequency-modulated signal;
the local oscillator circuit is configured to selectively:
generate the first frequency-modulated signal based on the calibration mode; and
generate a second frequency-modulated signal based on a proximity detection mode; and
the transmitter is configured to generate, based on the proximity detection mode, a proximity detection signal by performing frequency upconversion using the second frequency-modulated signal.

13. The apparatus of claim 12, wherein:
the first frequency-modulated signal has a first bandwidth; and
the second frequency-modulated signal has a second bandwidth that is larger than the first bandwidth.

14. A method comprising:
disconnecting a local oscillator circuit from a mixer of a receiver based on a calibration mode;
connecting the local oscillator circuit to an input or an output of a component that is disposed within a signal propagation path of the receiver based on the calibration mode;
generating, by the local oscillator circuit, a frequency-modulated signal in accordance with the calibration mode;
injecting the frequency-modulated signal into the signal propagation path of the receiver;
disconnecting the local oscillator circuit from the input or the output of the component based on a proximity detection mode;
connecting the local oscillator circuit to a mixer of a transmitter based on the proximity detection mode;
generating, by the local oscillator circuit, another frequency-modulated signal in accordance with the proximity detection mode;
generating a proximity detection signal by upconverting a transmit signal using the other frequency-modulated signal and the mixer of the transmitter;
connecting an output of the mixer of the transmitter to a mixer of the receiver based on the proximity detection mode; and
connecting the input or the output of the component to another component that is disposed within the signal propagation path of the receiver based on the proximity detection mode.

15. The method of claim 14, wherein the frequency-modulated signal exhibits a linear characteristic between a frequency of the frequency-modulated signal and time.

16. The method of claim 14, further comprising:
disconnecting the local oscillator circuit from the input or the output of the component based on a wireless communication mode;
connecting the input or the output of the component to another component that is disposed within the signal propagation path of the receiver based on the wireless communication mode;
connecting the local oscillator circuit to a mixer of the receiver based on the wireless communication mode; and generating, by the local oscillator circuit, a local oscillation signal in accordance with the wireless communication mode.

17. An apparatus comprising:
a modem configured to generate a mode control signal; and
a wireless transceiver coupled to the modem and comprising a portion of a signal propagation path of a receiver, the wireless transceiver configured to:
accept the mode control signal;
receive a downlink signal using the portion of the signal propagation path of the receiver based on the mode control signal indicating a wireless communication mode; and
inject a frequency-modulated signal into the signal propagation path of the receiver based on the mode control signal indicating a calibration mode,
wherein the wireless transceiver is configured to propagate the frequency-modulated signal through the portion of the signal propagation path of the receiver based on the calibration mode, and
wherein the modem comprises:
another portion of the signal propagation path of the receiver; and
a distortion-compensation circuit disposed within the other portion of the signal propagation path, the distortion-compensation circuit configured to:
accept the propagated frequency-modulated signal;
determine a frequency response of the receiver based on the propagated frequency-modulated signal; and
filter the downlink signal using a filter with a frequency response that at least partially compensates for a distortion artifact present within the frequency response of the receiver.

18. The apparatus of claim 17, wherein the wireless transceiver is configured to inject the frequency-modulated signal at a point within the signal propagation path that is associated with radio frequencies.

19. The apparatus of claim 17, wherein the wireless transceiver is configured to inject the frequency-modulated signal at a point within the signal propagation path that is associated with intermediate frequencies.

20. The apparatus of claim 17, wherein the wireless transceiver is configured to inject the frequency-modulated signal at a point within the signal propagation path that is associated with baseband frequencies.

21. The apparatus of claim 17, wherein the frequency-modulated signal comprises a linear-frequency-modulated signal.

22. An apparatus comprising:
a receiver comprising a signal propagation path; and
a radio-frequency integrated circuit comprising:
a mixer;
a local oscillator circuit configured to generate a frequency-modulated signal;
an injection circuit coupled to the receiver and the local oscillator circuit, the injection circuit configured to selectively:
connect the local oscillator circuit to an output of the mixer to inject the frequency-modulated signal into the signal propagation path of the receiver; and
disconnect the local oscillator circuit from the output of the mixer; and
at least a portion of the signal propagation path of the receiver.

23. The apparatus of claim 22, wherein the frequency-modulated signal comprises a linear-frequency-modulated signal.

24. The apparatus of claim 22, wherein:
the local oscillator circuit is configured to selectively:
generate the frequency-modulated signal based on a calibration mode; and
generate a local oscillator signal based on a wireless communication mode; and
the receiver is configured to:
receive a downlink signal based on the wireless communication mode; and
downconvert a frequency of the downlink signal using the local oscillator signal.

25. The apparatus of claim 22, further comprising:
a transmitter coupled to the local oscillator circuit, wherein:
the frequency-modulated signal comprises a first frequency-modulated signal;
the local oscillator circuit is configured to selectively:
generate the first frequency-modulated signal based on a calibration mode; and
generate a second frequency-modulated signal based on a proximity detection mode; and
the transmitter is configured to generate, based on the proximity detection mode, a proximity detection signal by performing frequency upconversion using the second frequency-modulated signal.

26. The apparatus of claim 25, wherein:
the first frequency-modulated signal has a first bandwidth; and
the second frequency-modulated signal has a second bandwidth that is larger than the first bandwidth.

27. An apparatus comprising:
a receiver comprising a signal propagation path; and
a radio-frequency integrated circuit comprising:
a local oscillator circuit configured to generate a frequency-modulated signal;
an injection circuit coupled to the receiver and the local oscillator circuit, the injection circuit comprising:
at least one frequency translation circuit coupled to the local oscillator circuit, the at least one frequency translation circuit configured to increase or decrease frequencies of the frequency-modulated signal; and
at least one switch coupled to the at least one frequency translation circuit and disposed within the signal propagation path, the at least one switch configured to selectively:
connect the at least one frequency translation circuit to a component within the signal propagation path of the receiver; and
disconnect the at least one frequency translation circuit from the component and connect the component to another component within the signal propagation path of the receiver,
wherein the injection circuit is configured to selectively:
connect the local oscillator circuit to the signal propagation path of the receiver to inject the frequency-modulated signal into the signal propagation path of the receiver; and
disconnect the local oscillator circuit from the signal propagation path of the receiver, and
at least a portion of the signal propagation path of the receiver.

28. The apparatus of claim 27, wherein the injection circuit comprises at least one buffer coupled between the local oscillator circuit and the at least one frequency translation circuit.

29. The apparatus of claim 27, wherein the frequency-modulated signal comprises a linear-frequency-modulated signal.

30. The apparatus of claim 27, wherein:
the local oscillator circuit is configured to selectively:
generate the frequency-modulated signal based on a calibration mode; and
generate a local oscillator signal based on a wireless communication mode; and
the receiver is configured to:
receive a downlink signal based on the wireless communication mode; and
downconvert a frequency of the downlink signal using the local oscillator signal.

* * * * *